(12) United States Patent
Takechi et al.

(10) Patent No.: US 11,380,798 B2
(45) Date of Patent: Jul. 5, 2022

(54) THIN-FILM DEVICE

(71) Applicant: Tianma Japan, Ltd., Kanagawa (JP)

(72) Inventors: Kazushige Takechi, Kanagawa (JP); Jun Tanaka, Kanagawa (JP); Kenji Sera, Xiamen (CN); Yong Yuan, Xiamen (CN)

(73) Assignees: WUHAN TIANMA MICRO-ELECTRONICS CO., LTD., Wuhan (CN); TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 16/899,665

(22) Filed: Jun. 12, 2020

(65) Prior Publication Data

US 2020/0395488 A1 Dec. 17, 2020

(30) Foreign Application Priority Data

Jun. 14, 2019 (JP) .............................. JP2019-110865
Feb. 17, 2020 (JP) .............................. JP2020-024601

(51) Int. Cl.
| *H01L 29/786* | (2006.01) |
| *H01L 29/66* | (2006.01) |
| *H01L 21/02* | (2006.01) |
| *H01L 29/49* | (2006.01) |

(52) U.S. Cl.
CPC .. *H01L 29/78651* (2013.01); *H01L 21/02631* (2013.01); *H01L 29/4908* (2013.01); *H01L 29/6675* (2013.01); *H01L 29/78618* (2013.01)

(58) Field of Classification Search
CPC ......... H01L 29/78651; H01L 29/78618; H01L 29/6675; H01L 21/02631; H01L 29/4908; H01L 27/1248; H01L 27/1225; H01L 27/1222; H01L 27/127; H01L 27/1251; H01L 27/1229; H01L 27/3262; H01L 29/78672; H01L 29/7869; H01L 29/0847; H01L 29/66969; H01L 2227/323
See application file for complete search history.

(56) References Cited

U.S. PATENT DOCUMENTS

| 2015/0055051 A1 | 2/2015 | Osawa et al. | |
| 2017/0155000 A1 | 6/2017 | Moon et al. | |
| 2017/0301860 A1* | 10/2017 | Yamazaki | ........... H01L 27/3262 |
| 2018/0061922 A1* | 3/2018 | Kim | .................. H01L 27/3262 |
| 2018/0122835 A1 | 5/2018 | Watakabe et al. | |
| 2018/0240855 A1 | 8/2018 | Lee et al. | |
| 2019/0198534 A1* | 6/2019 | Je | ...................... H01L 21/02565 |
| 2020/0105799 A1* | 4/2020 | Yuan | .................. H01L 27/1229 |

* cited by examiner

*Primary Examiner* — Mohammed R Alam
(74) *Attorney, Agent, or Firm* — Nixon & Vanderhye

(57) ABSTRACT

A thin-film device includes a polysilicon element and an oxide semiconductor element. The polysilicon element includes a first part made of low-resistive polysilicon. The oxide semiconductor element includes a second part made of low-resistive oxide semiconductor. The first part and the second part are disposed to overlap each other and connected.

15 Claims, 32 Drawing Sheets

THIN-FILM DEVICE

CROSS-REFERENCE TO RELATED APPLICATIONS

This non-provisional application claims priority under 35 U.S.C. § 119(a) on Patent Application No. 2019-110865 filed in Japan on Jun. 14, 2019 and Patent Application No. 2020-024601 filed in Japan on Feb. 17, 2020, the entire contents of which are hereby incorporated by reference.

BACKGROUND

This disclosure relates to a thin-film device.

A technology of incorporating a low-temperature polysilicon thin-film transistor (LTPS TFT) and an oxide semiconductor TFT into one pixel circuit is used practically. This technology is referred to as hybrid TFT display (HTD) technology in this description. The HTD technology incorporates both a low-temperature polysilicon TFT having high mobility and an oxide semiconductor TFT that generates small leakage current in a pixel circuit to achieve higher display quality and lower power consumption.

For example, US 2015/0055051 A and US 2018/0240855 A disclose techniques in the HTD technology. The techniques according to these patent documents both connect a source/drain of a low-temperature polysilicon TFT with a source/drain of an oxide semiconductor TFT through via hole(s) (contact hole(s)) and a metal line.

SUMMARY

An aspect of this disclosure is a thin-film device including a polysilicon element, and an oxide semiconductor element. The polysilicon element includes a first part made of low-resistive polysilicon. The oxide semiconductor element includes a second part made of low-resistive oxide semiconductor. The first part and the second part are disposed to overlap each other and connected.

Another aspect of this disclosure is a method of manufacturing a thin-film device, including: forming a polysilicon film including a third part made of highly-resistive polysilicon and a fourth part made of low-resistive polysilicon; and forming an oxide semiconductor film including a fifth part made of highly-resistive oxide semiconductor and a sixth part made of low-resistive oxide semiconductor that is disposed to overlap the fourth part and connected with the fourth part.

It is to be understood that both the foregoing general description and the following detailed description are exemplary and explanatory and are not restrictive of this disclosure.

EMBODIMENTS

Figure 1:
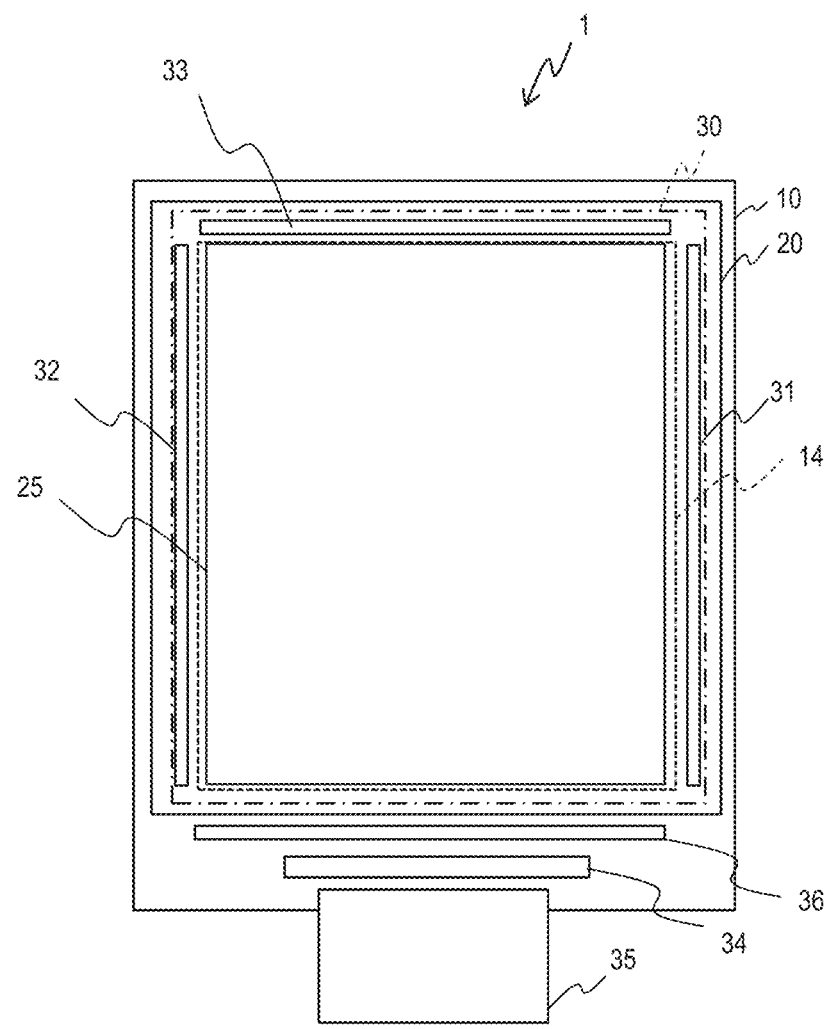
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of description.

Overview

The following description employs an organic light-emitting diode (OLED) display device as an example of a thin-film device. The OLED display device in this disclosure includes a low-temperature polysilicon thin-film transistor (LTPS TFT) and an oxide semiconductor TFT in a pixel circuit and/or a peripheral circuit, in which a source/drain of the low-temperature polysilicon TFT is physically connected with a source/drain of the oxide semiconductor TFT.

Specifically, the low-temperature polysilicon TFT has a source/drain made of polysilicon reduced in resistance (low-resistive polysilicon) and the oxide semiconductor TFT has a source/drain made of oxide semiconductor reduced in resistance (low-resistive oxide semiconductor). The sheet resistance of a common low-resistive source/drain is within a range from 10 Ω to 100 kΩ, for example, from several dozen ohms to several dozen kilo-ohms. The sheet resistance of a common channel that is not reduced in resistance, namely a highly-resistive channel, is usually within a range from 1 MΩ to 10 GΩ, for example, from several megaohms to several giga ohms.

A source/drain of a low-temperature polysilicon TFT and a source/drain of an oxide semiconductor TFT overlap each other at least partially when seen in the layering direction and they are connected with each other directly or through a conductor. The conductor connecting the sources/drains of the two TFTs can be a metal or a low-resistive semiconductor.

A configuration such that a source/drain of a low-temperature polysilicon TFT is connected with a source/drain of an oxide semiconductor TFT through two via holes (contact holes) and a metal film leads to a circuit having a large area because of the two via holes. Specifically, a via hole occupies a large area and requires design margins between the via hole and other elements. Accordingly, increase in number of via holes hinders achievement of higher resolution. The configurations of this disclosure have a smaller number of via holes for connecting the sources/drains of the low-temperature polysilicon TFT and the oxide semiconductor TFT to achieve a smaller circuit area.

The foregoing applies to thin-film devices including a polysilicon element and an oxide semiconductor element that is different from display devices. Increase in number of via holes hinders reduction in circuit size. Accordingly, the aforementioned connection of a low-temperature polysilicon TFT and an oxide semiconductor TFT can be used in connection of other semiconductor elements. One of the semiconductor elements is a polysilicon element including a conductive part (first part) made of low-resistive polysilicon and the other one is an oxide semiconductor element including a conductive part (second part) made of a low-resistive oxide semiconductor. The two conductive parts are disposed to overlap each other and connected. The polysilicon element does not need to be made of low-temperature polysilicon.

Oxide semiconductors have low tolerance to hydrogen fluoride (HF). If HF treatment is applied to etch silicon oxide on the surface of a source/drain (contact region) of a low-temperature polysilicon TFT, the exposed oxide semiconductor is etched together. Such HF treatment can be eliminated by providing an oxide semiconductor film over the contact region of the source/drain of the low-temperature polysilicon TFT.

Embodiment 1

Configuration of Display Device

FIG. 1 schematically illustrates a configuration example of an OLED display device 1. The OLED display device 1 includes a thin-film transistor (TFT) substrate 10 on which OLED elements are formed, an encapsulation substrate 20 for encapsulating the OLED elements, and a bond (glass frit sealer) 30 for bonding the TFT substrate 10 with the encapsulation substrate 20. The space between the TFT substrate 10 and the encapsulation substrate 20 is filled with dry nitrogen and sealed up with the bond 30. The encapsulation substrate 20 and the bond 30 constitute a structural encapsulation unit. The structural encapsulation unit can have a thin film encapsulation (TFE) structure.

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to the external devices via flexible printed circuits (FPC) 35. The scanning driver 31, the emission driver 32, and the protection circuit 33 are peripheral circuits fabricated on the TFT substrate 10.

The scanning driver 31 drives scanning lines on the TFT substrate 10. The emission driver 32 drives emission control lines to control the light emission periods of pixels. The protection circuit 33 protects the elements from electrostatic discharge. The driver IC 34 is mounted with an anisotropic conductive film (ACF), for example.

The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in series (d is an integer more than 1). The demultiplexer 36 changes the output data line for the data signal from the driver IC 34 $d$ times per scanning period to drive d times as many data lines as output pins of the driver IC 34.

Configuration of Pixel Circuit

Figure 2A:
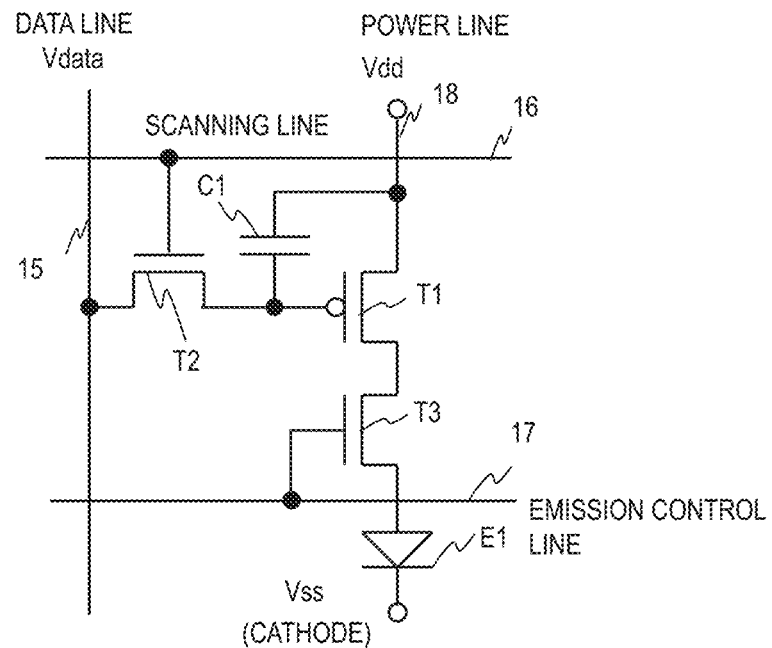
FIG. 2A illustrates a configuration example of a pixel circuit.

A plurality of pixel circuits are formed on the TFT substrate 10 to control electric current to be supplied to the anode electrodes of subpixels (also simply referred to as pixels). FIG. 2A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the sub-pixel. The selection transistor T2 is an n-channel type of oxide semiconductor TFT and its gate terminal is connected with a scanning line 16. The source terminal is connected with a data line 15. The drain terminal is connected with the gate terminal of the driving transistor T1.

The driving transistor T1 is a transistor (driving TFT) for driving the OLED element E1. The driving transistor T1 is a p-channel type of low-temperature polysilicon TFT and its gate terminal is connected with the drain terminal of the selection transistor T2. The source terminal of the driving transistor T1 is connected with a power line (Vdd) 18. The drain terminal is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is an n-channel type of oxide semiconductor TFT and its gate terminal is connected with an emission control line 17. The source terminal of the emission transistor T3 is connected with the drain terminal of the driving transistor T1. The drain terminal of the emission transistor T3 is connected with the OLED element E1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 2B:
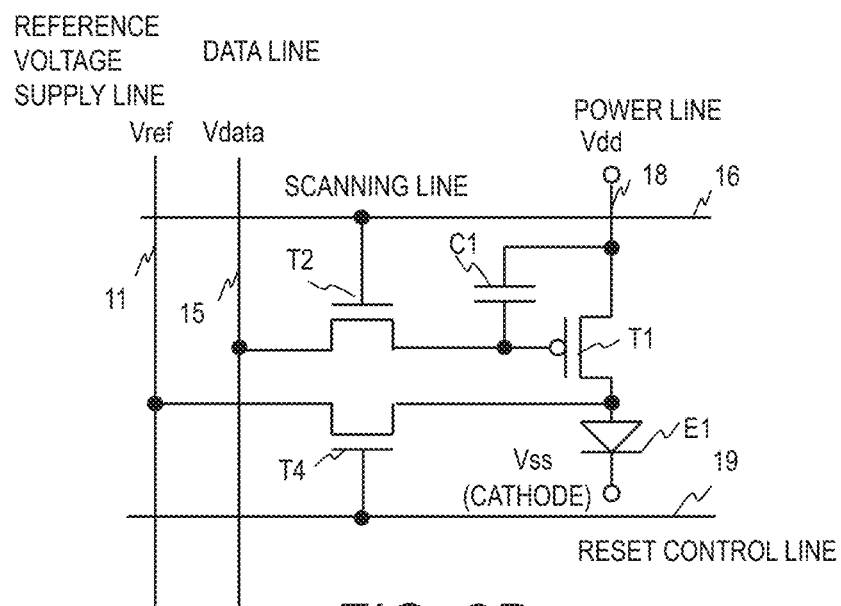
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 is an n-channel type of oxide semiconductor TFT. The reset transistor T4 controls the electric connection between a reference voltage supply line 11 and the anode of the OLED element E1. This control is performed in accordance with a reset control signal supplied from a reset control line 19 to the gate of the reset transistor T4. This reset transistor T4 can be used for various purposes.

Figure 2C:
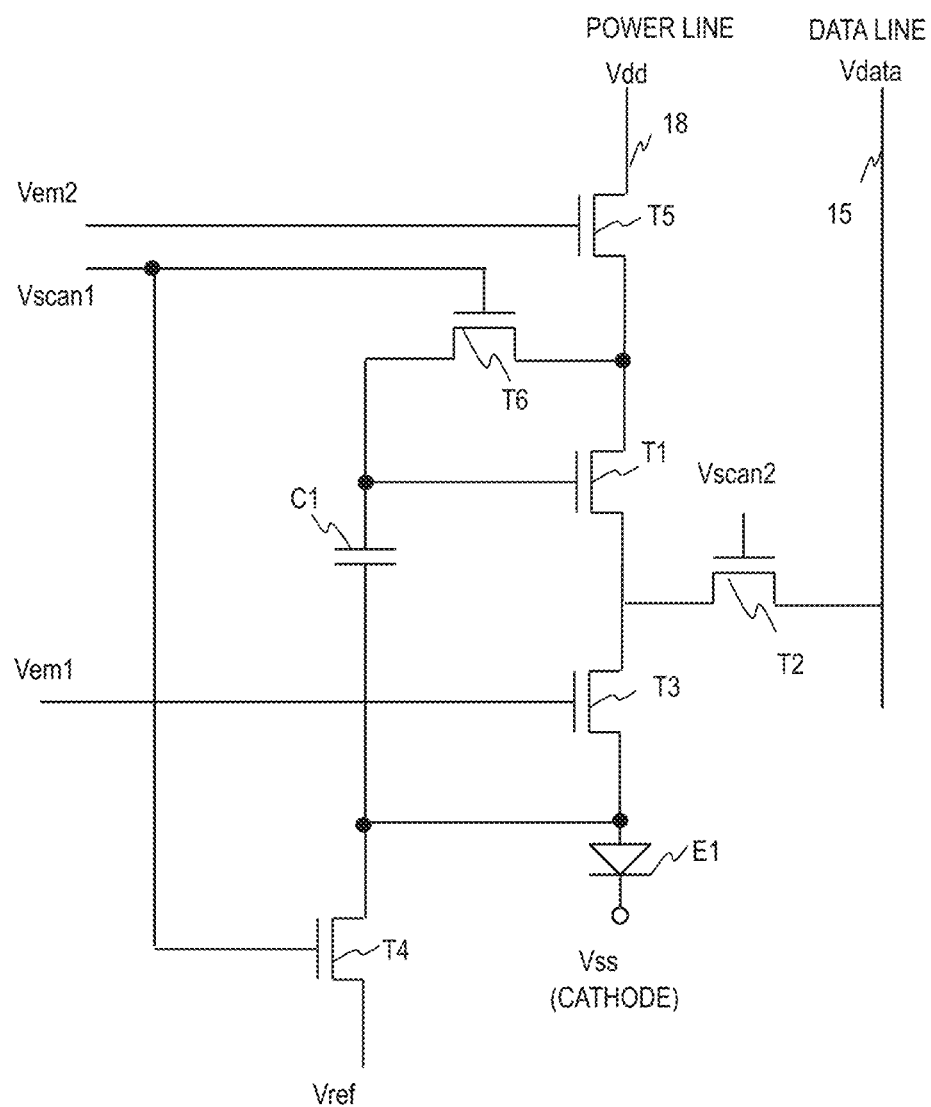
FIG. 2C illustrates still another configuration example of a pixel circuit.

FIG. 2C illustrates still another configuration example of a pixel circuit. This pixel circuit includes n-channel type of transistors T1 to T7. The gate terminal of the selection transistor T2 is supplied with a Vscan2 signal. A storage capacitor C1 is supplied with a data voltage through the selection transistor T2. The gates of the transistors T4 and T6 are supplied with a Vscan1 signal. The transistors T4 and T6 supply Vref to the anode of an OLED element E1 to set a threshold voltage to the storage capacitor C1. The gates of the transistors T3 and T5 are supplied with signals Vem1 and Vem2, respectively, to control light emission of the OLED element E1.

The driving transistor T1 can be a low-temperature polysilicon TFT and the transistor T6 can be an oxide semiconductor TFT. The other transistors can be low-temperature polysilicon TFTs or oxide semiconductor TFTs. A source/drain of the driving transistor T1 is connected with a source/drain of the transistor T6. The circuit configurations in FIGS. 2A, 2B, and 2C are examples; the pixel circuit may have a different circuit configuration.

The pixel circuits described above include a low-temperature polysilicon TFT and an oxide semiconductor TFT whose sources/drains are connected with each other. The connections described in this specification achieve a smaller number of via holes in a pixel circuit and contribute to higher resolution.

Connection Between Low-Temperature Polysilicon TFT and Oxide Semiconductor TFT

Hereinafter, configuration examples of interconnected low-temperature polysilicon TFT and oxide semiconductor TFT are described. The oxide semiconductor in the examples described in the following is assumed to be indium gallium zinc oxide (IGZO). The configurations described in this specification are applicable to elements made of other oxide semiconductors.

Figure 3:
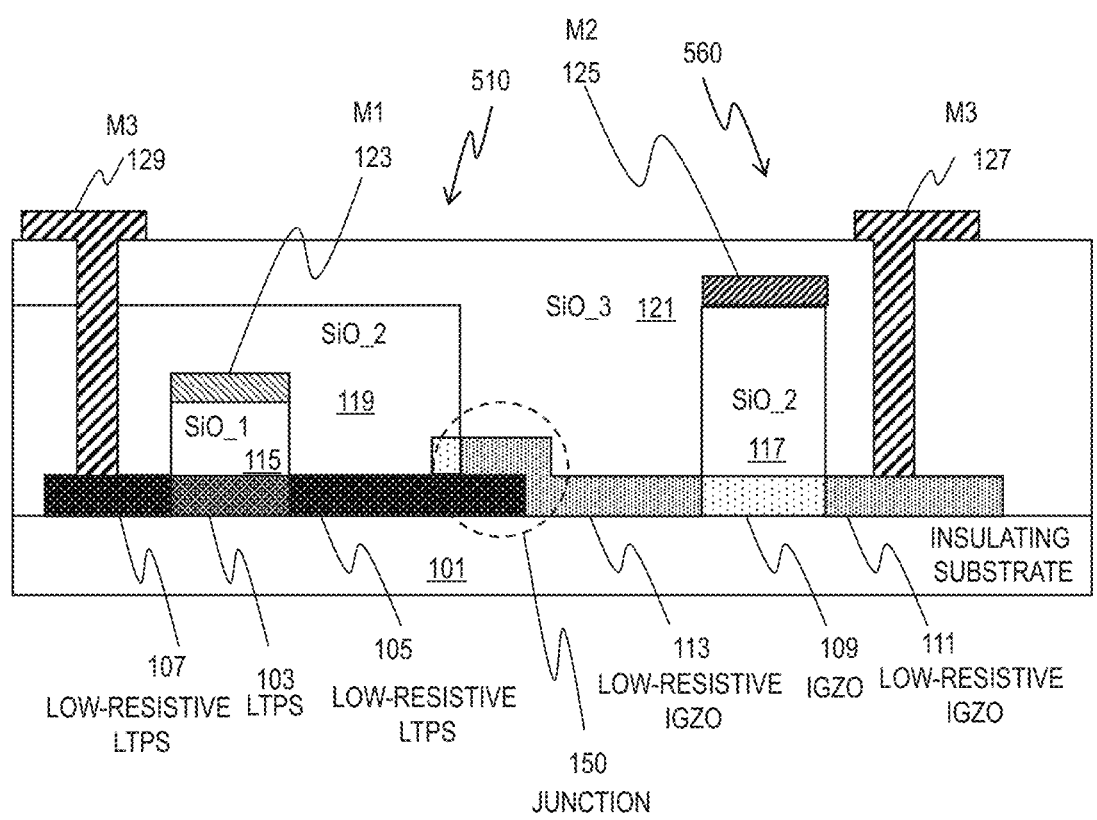
FIG. 3 illustrates cross-sectional structures of a low-temperature polysilicon TFT and an oxide semiconductor TFT whose sources/drains are in direct contact with each other.

FIG. 3 illustrates cross-sectional structures of a low-temperature polysilicon TFT 510 and an oxide semiconductor TFT 560 whose sources/drains are in direct contact with each other. The low-temperature polysilicon TFT 510 and the oxide semiconductor TFT 560 are fabricated on a flexible or inflexible insulating substrate 101 made of resin or glass.

The low-temperature polysilicon TFT 510 includes a source and a drain 105 and 107 and a channel 103 sandwiched by the source/drain 105 and 107 in an in-plane direction. The source/drain 105 and 107 are made of low-temperature polysilicon reduced in resistance by being doped with high-concentration impurities. The channel 103 is made of low-temperature polysilicon not reduced in resistance (highly-resistive low-temperature polysilicon).

The source/drain 105 and 107 and the channel 103 (semiconductor film) are included in a low-temperature polysilicon layer. The low-temperature polysilicon layer is formed directly on the insulating substrate 101. Although the source/drain 105 and 107 and the channel 103 in the example of FIG. 3 are in contact with the insulating substrate 101, another insulating layer such as a silicon nitride layer can be provided therebetween.

The low-temperature polysilicon TFT 510 further includes a gate 123 and a gate insulating film 115 interposed between the gate 123 and the channel 103 in the layering direction. The channel 103, the gate insulating film 115, and the gate 123 are layered in this order from the bottom (from the substrate side) and the gate insulating film 115 is in contact with the channel 103 and the gate 123. The gate 123 is made of metal and included in a metal layer M1. The gate insulating film 115 in this example is made of silicon oxide and included in a silicon oxide layer SiO_1. Although the low-temperature polysilicon TFT 510 in the example of FIG. 3 has a top-gate structure, the low-temperature polysilicon TFT 510 can have a bottom-gate structure.

The oxide semiconductor TFT 560 includes a source and a drain 111 and 113 and a channel 109 sandwiched by the source/drain 111 and 113 in an in-plane direction. The source/drain 111 and 113 are made of IGZO reduced in resistance. The channel 109 is made of IGZO not reduced in resistance (highly-resistive IGZO).

The source/drain 111 and 113 and the channel 109 (semiconductor film) are included in an oxide semiconductor layer. The oxide semiconductor layer is formed directly on the insulating substrate 101. Although the source/drain 111 and 113 and the channel 109 in the example of FIG. 3 is in contact with the insulating substrate 101, another insulating layer such as a silicon nitride layer can be provided therebetween.

The oxide semiconductor TFT 560 further includes a gate 125 and a gate insulating film 117 interposed between the gate 125 and the channel 109 in the layering direction. The channel 109, the gate insulating film 117, and the gate 125 are layered in this order from the bottom (from the substrate side) and the gate insulating film 117 is in contact with the channel 109 and the gate 125. The gate 125 is made of metal and included in a metal layer M2. The gate insulating film 117 in this example is made of silicon oxide and included in a silicon oxide layer SiO_2. Although the oxide semiconductor TFT 560 in the example of FIG. 3 has a top-gate structure, the oxide semiconductor TFT 560 can have a bottom-gate structure.

The source/drain 105 of the low-temperature polysilicon TFT 510 and the source/drain 113 of the oxide semiconductor TFT 560 are connected at a junction 150. At the junction 150, a part (first part) of the source/drain 105 of the low-temperature polysilicon TFT 510 and a part (second part) of the source/drain 113 of the oxide semiconductor TFT 560 overlap each other. These parts are layered when seen in the layering direction and further, they are in direct contact with each other. In the example of FIG. 3, one end of the source/drain 113 of the oxide semiconductor TFT 560 is located upper than one end of the source/drain 105 of the low-temperature polysilicon TFT 510.

An interlayer insulating film 119 covers and is in contact with the source/drain 107, the gate 123, and a part of the source/drain 105 of the low-temperature polysilicon TFT 510 and a part of the source/drain 113 of the oxide semiconductor TFT 560. The interlayer insulating film 119 in this example is made of silicon oxide and included in a silicon oxide layer SiO_2.

An interlayer insulating film 121 covers and is in contact with a part of the source/drain 113, the gate 125, and the source/drain 111 of the oxide semiconductor TFT 560. The interlayer insulating film 121 in this example is made of silicon oxide and included in a silicon oxide layer SiO_3. Although the interlayer insulating film 119 in the configuration example in FIG. 3 has a single layer structure consisting of the silicon oxide layer SiO_2, the interlayer insulating film 119 can have a multi-layer structure consisting of a silicon oxide layer and a silicon nitride layer stacked in this order.

An electrode 129 is provided above the interlayer insulating film 121 and connected with the source/drain 107 of the low-temperature polysilicon TFT 510 through a via hole opened in the interlayer insulating films 119 and 121. The via inside the via hole interconnects the electrode 129 and the source/drain 107. The electrode 129 and the via is made of the same metal. The electrode 129 is made of metal and included in a metal layer M3.

An electrode 127 is provided above the interlayer insulating film 121 and connected with the source/drain 111 of the oxide semiconductor TFT 560 through a via hole opened in the interlayer insulating film 121. The via inside the via hole interconnects the electrode 127 and the source/drain 111. The electrode 127 and the via is made of the same metal. The electrode 127 is made of metal and included in the metal layer M3. The insulating layers can be made of a material different from silicon oxide, such as silicon nitride.

Manufacturing Method

Figure 4:
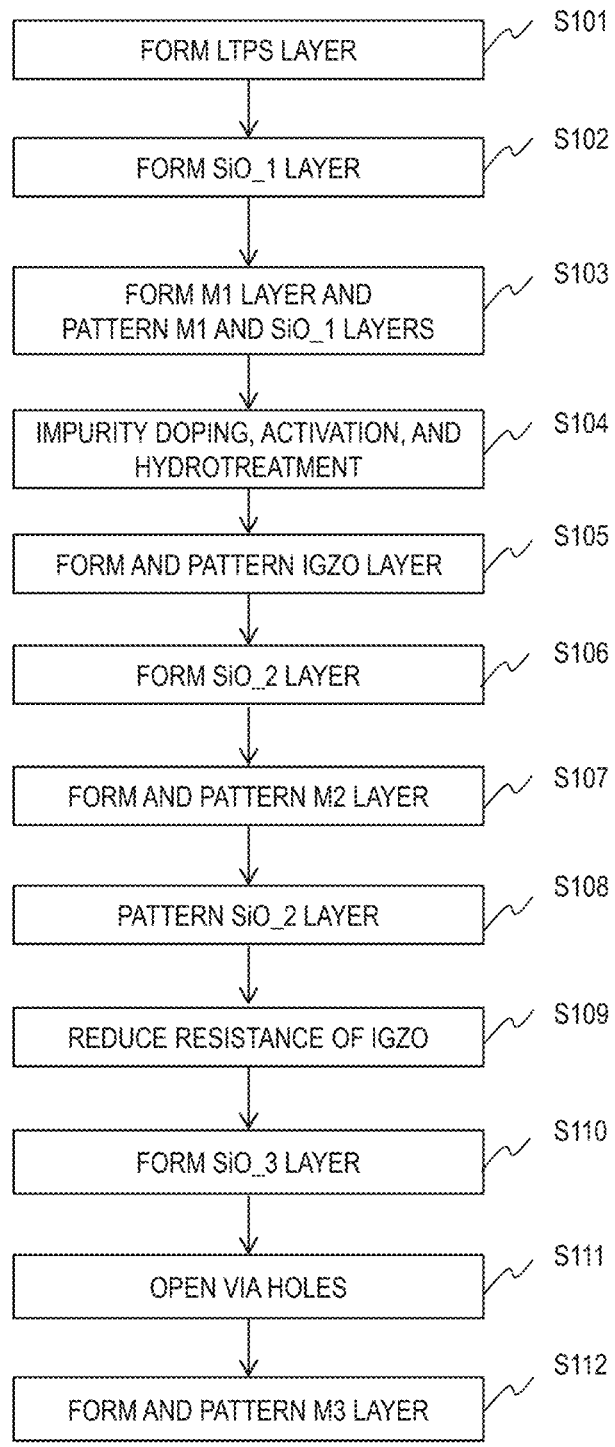
FIG. 4 is a flowchart of an example of a method of manufacturing the configuration example illustrated in FIG. 3.

A method of manufacturing the TFTs 510 and 560 illustrated in FIG. 3 is described. FIG. 4 is a flowchart of an example of the method of manufacturing these TFTs. The method forms a low-temperature polysilicon layer on an insulating substrate 101 (S101). Specifically, the (low-temperature) polysilicon film can be formed by depositing amorphous silicon by CVD and crystalizing the amorphous silicon by excimer laser annealing. The polysilicon film is patterned into islands by photolithography.

Next, the method forms a silicon oxide layer SiO_1 by CVD (S102), further forms a metal layer M1 by sputtering, and patterns the metal layer M1 and the silicon oxide layer SiO_1 together by photolithography (S103). Next, the method dopes the source/drain regions of the polysilicon film with impurities using the gate 123 (the metal layer M1) as a mask and activates the impurities. Further, the method terminates the dangling bonds by hydrotreatment (S104).

Next, the method forms an IGZO layer by sputtering and patterns the IGZO layer by photolithography (S105). Next, the method forms a silicon oxide layer SiO_2 (S106). Next, the method forms a metal layer M2 by sputtering and patterns the metal layer M2 by photolithography (S107). The material for the gates 123 and 125 can be selected desirably from Mo, W, Nb, and Al, for example. The gates 123 and 125 can have a single layer structure or a multi-layer structure.

Next, the method patterns the silicon oxide layer SiO_2 by photolithography (S108). Next, the method reduces the resistance of the source/drain regions of the IGZO layer using the metal layer M2 (the gate 125) as a mask (S109). The resistance can be reduced by exposing the source/drain regions of the IGZO layer to He plasma or by implanting B, Ar, or H ions. Next, the method forms a silicon oxide film SiO_3 (S110). Next, the method opens via holes in the silicon oxide layers SiO_2 and SiO_3 by anisotropic etching (S111).

Next, the method forms a metal layer M3 by sputtering and patterns the metal layer M3 by photolithography (S112). The metal layer M3 includes electrodes 127 and 129 and further, vias (the inner parts coating or filling the via holes) for connecting the electrodes 127 and 129 to the source/ drain 111 of the oxide semiconductor TFT and the source/drain 107 of the low-temperature polysilicon TFT, respectively.

The electrodes 127 and 129 can be formed by depositing and patterning conductive films of Ti/Al/Ti, for example. The electrodes 127 and 129 can have a single layer structure or be made of metals different from these metals.

Figure 5:
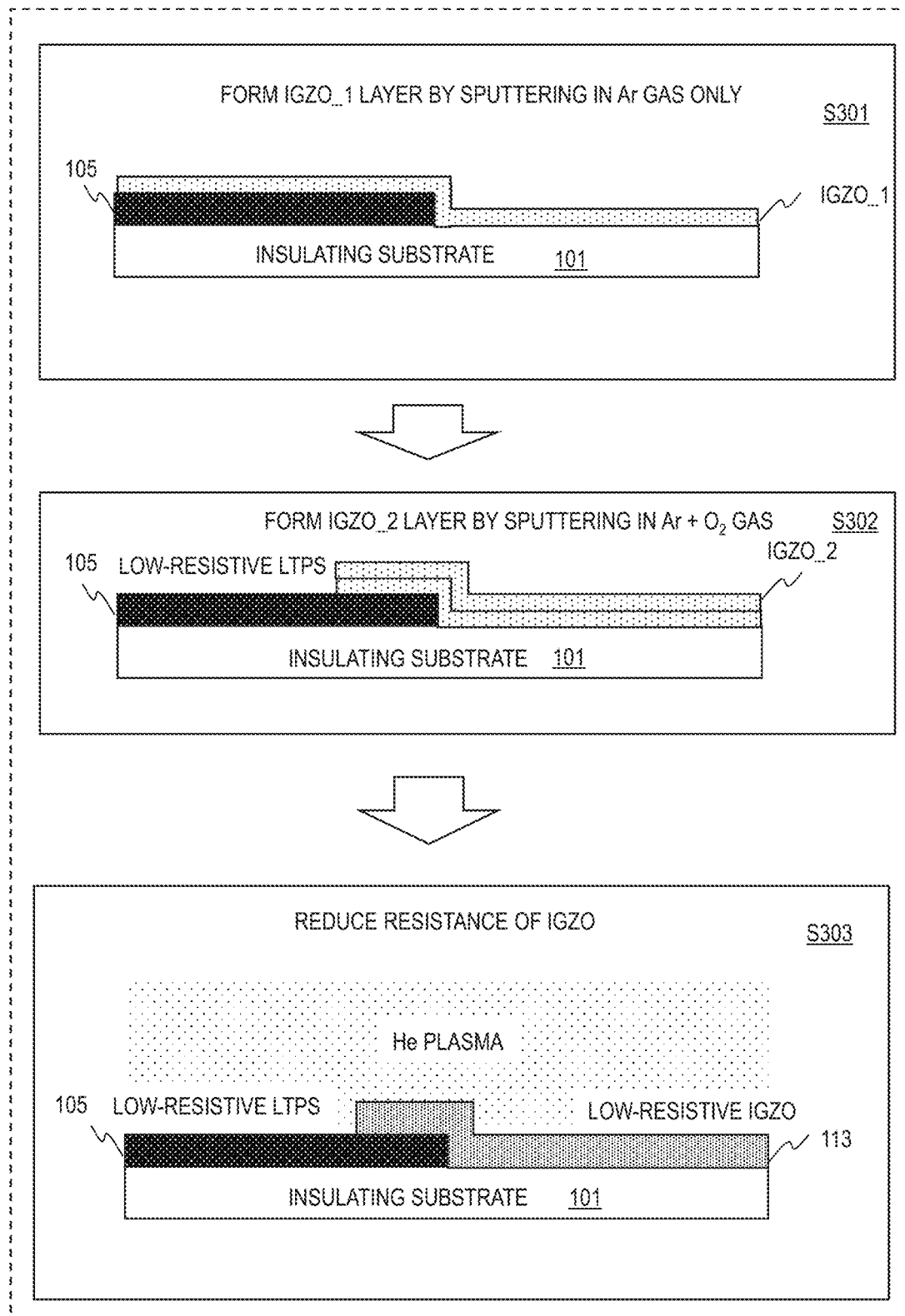
FIG. 5 is a diagram illustrating an example of a process to attain lower contact resistance.

In the configuration example in FIG. 3, a low-resistive LTPS part of the low-temperature polysilicon TFT 510 and a low-resistive IGZO part of the oxide semiconductor TFT 560 are in direct contact with each other at the junction 150. Examples of a process (manufacturing method) to attain lower contact resistance at their interface are described. FIG. 5 is a diagram illustrating an example of the process to attain lower contact resistance.

After preparing the source/drain 105 by doping the low-temperature polysilicon layer with impurities, the method forms an oxide semiconductor layer IGZO_1 (first oxide semiconductor film) by sputtering in argon (Ar) gas only (S301). The oxide semiconductor layer IGZO_1 covers the surface of the source/drain 105.

Next, the method forms another oxide semiconductor layer IGZO_2 (second oxide semiconductor film) by sputtering in argon (Ar) gas and oxygen ($O_2$) gas and patterns the oxide semiconductor layers IGZO_1 and IGZO_2 by photolithography (S302). Next, the method reduces the resistance of a part of the oxide semiconductor layers IGZO_1 and IGZO_2 with He plasma to prepare a source/drain 113 (S303). A part of the source/drain 113 covers and is in contact with a part of the source/drain 105 that includes one end thereof.

As described above, the oxide semiconductor layer IGZO_1 is formed without using $O_2$ gas and therefore, the interface of the low-resistive LTPS part with the low-resistive IGZO part is not oxidized in forming the oxide semiconductor layer. As a result, lower contact resistance is attained at the interface between the low-resistive LTPS part and the low-resistive IGZO part.

Figure 6A:
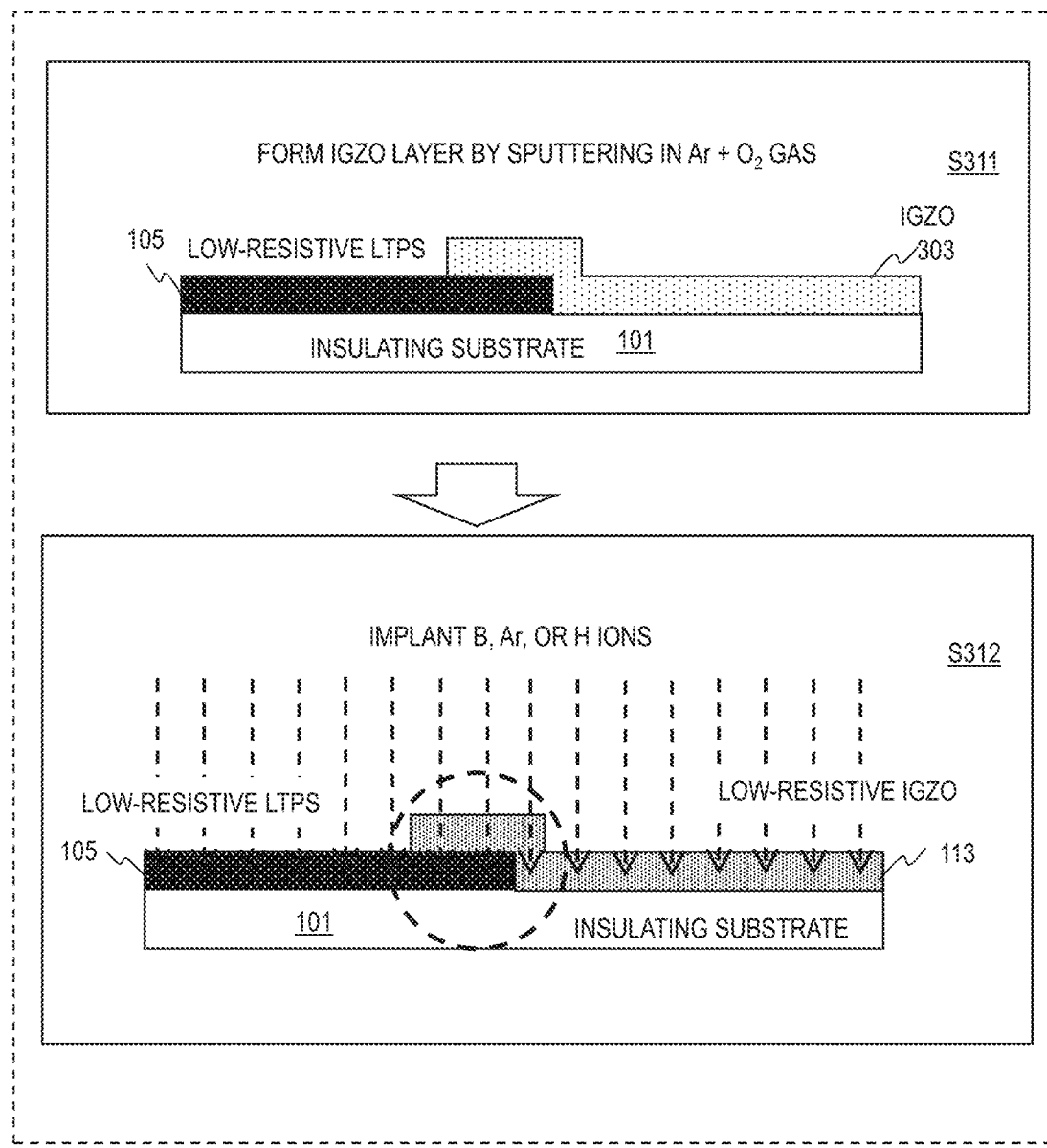
FIG. 6A is a diagram illustrating another example of a process to lower contact resistance.

FIG. 6A is a diagram illustrating another example of the process to attain lower contact resistance. After preparing the source/drain 105 by doping the low-temperature polysilicon layer with impurities, the method forms an IGZO layer by sputtering in an atmosphere of Ar and $O_2$ gas and patterns the IGZO layer by photolithography to prepare an IGZO film 303 (S311). A part of the IGZO film 303 covers and is in contact with a part of the source/drain 105 that includes one end thereof.

Next, the method implants ions such as B, Ar, or H ions to the IGZO film 303 to reduce the resistance of the IGZO film 303 (S312). The ion implantation reduces the contact resistance at the interface between the low-resistive LTPS part and the low-resistive IGZO part. Since the ions are implanted to the regions other than the contact region of the low-temperature polysilicon layer, an element having less effect on the characteristics of the other regions is to be selected.

Figure 6B:
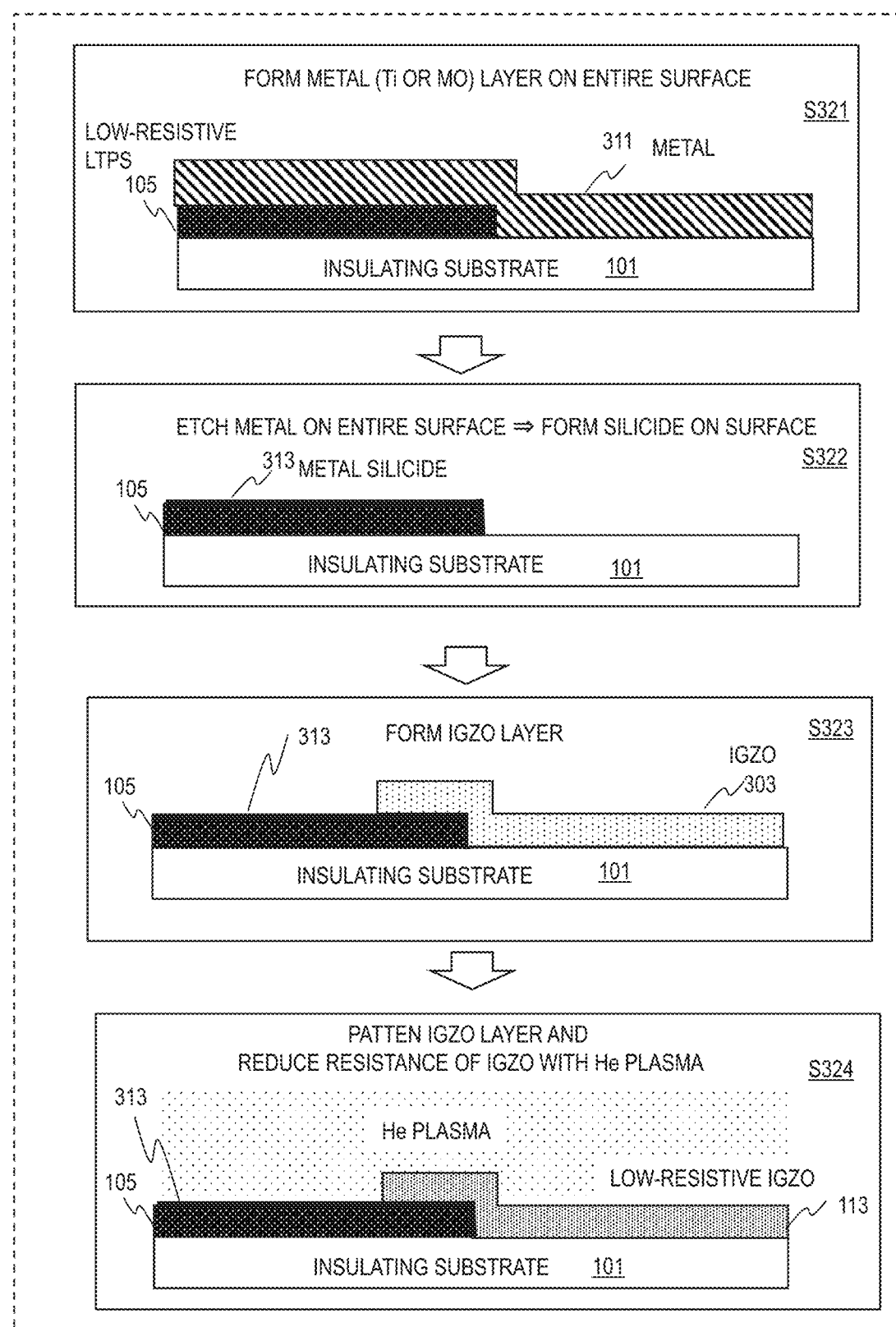
FIG. 6B is a diagram illustrating still another example of a process to attain lower contact resistance.

FIG. 6B is a diagram illustrating still another example of the process to attain lower contact resistance. After preparing the source/drain 105 by doping the low-temperature polysilicon layer with impurities, the method forms a metal film 311 by sputtering (S321). This metal film 311 can be a molybdenum or titanium film. In forming this metal film 311, interfacial reaction produces a metal silicide film 313 at the interface between the low-resistive LTPS and the metal film 311.

Subsequently, the method removes the metal film 311 by wet etching (S322). After the etching, the metal silicide film 313 remains on the surface of the low-resistive LTPS. Next, the method forms an IGZO layer by sputtering in an atmosphere of Ar and $O_2$ gas and patterns the IGZO layer by photolithography to prepare the IGZO film 303 (S323). A part of the IGZO film 303 covers and is in contact with a part of the source/drain 105 that includes one end thereof. Next, the method reduces the resistance of the IGZO film 303 with He plasma (S324).

As described above, a metal silicide film is formed at the interface between the low-resistive LTPS part and the low-resistive IGZO part. This metal silicide film reduces the contact resistance at the interface between the low-resistive LTPS part and the low-resistive IGZO part. The metal silicide film can be a layer of a mixture of at least one of indium, gallium, and zinc elements of the constituent elements of the low-resistive IGZO, silicon element, and a metallic element. The metallic element can be molybdenum or titanium.

Embodiment 2

Figure 7:
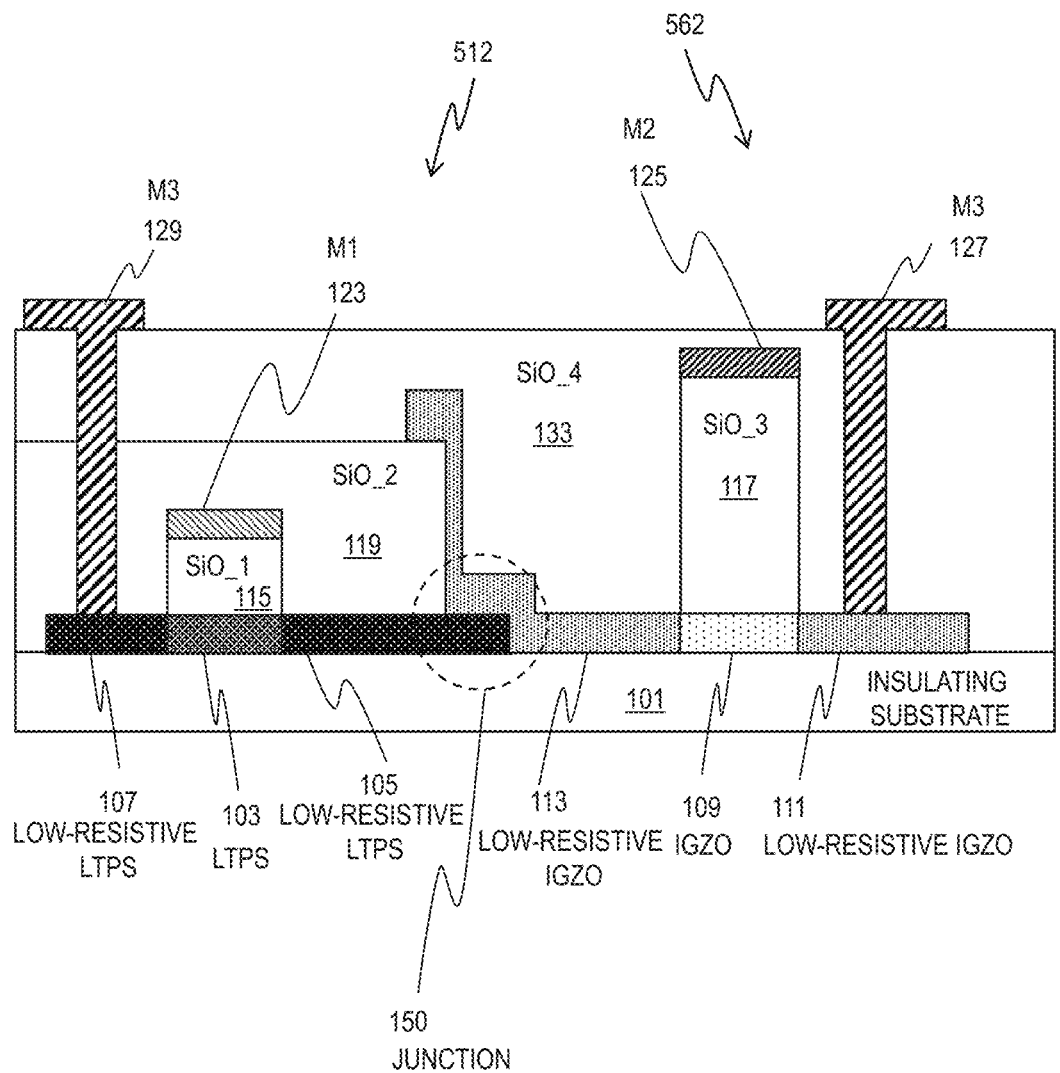
FIG. 7 illustrates cross-sectional structures of a low-temperature polysilicon TFT and an oxide semiconductor TFT whose sources/drains are in direct contact with each other.

Another configuration example of a low-temperature polysilicon TFT and an oxide semiconductor TFT whose sources/drains are in direct contact with each other is described. FIG. 7 illustrates cross-sectional structures of a low-temperature polysilicon TFT 512 and an oxide semiconductor TFT 562 whose sources/drains are in direct contact with each other. In the following, differences from the configuration example illustrated in FIG. 3 are mainly described.

The source/drain 113 of the oxide semiconductor TFT 562 is in a layer upper than the interlayer insulating film 119. In the example of FIG. 7, a part of the source/drain 113 covers and is in contact with a part of the source/drain 105 at the junction 150 and another part of the source/drain 113 covers and is in contact with a part of the interlayer insulating film 119. The gate insulating film 117 of the oxide semiconductor TFT 562 is included in a silicon oxide layer SiO_3. The interlayer insulating film 133 covering the low-temperature polysilicon TFT 512 and the oxide semiconductor TFT 562 is included in a silicon oxide layer SiO_4.

As described above, the low-temperature polysilicon TFT 512 in the configuration example in FIG. 7 includes a gate 123 disposed above the channel 103 with a gate insulating film 115 interposed therebetween and the gate 123 is covered with the interlayer insulating film 119. A part of the source/drain 113 of the oxide semiconductor TFT 562 is located upper than the interlayer insulating film 119.

Figure 8:
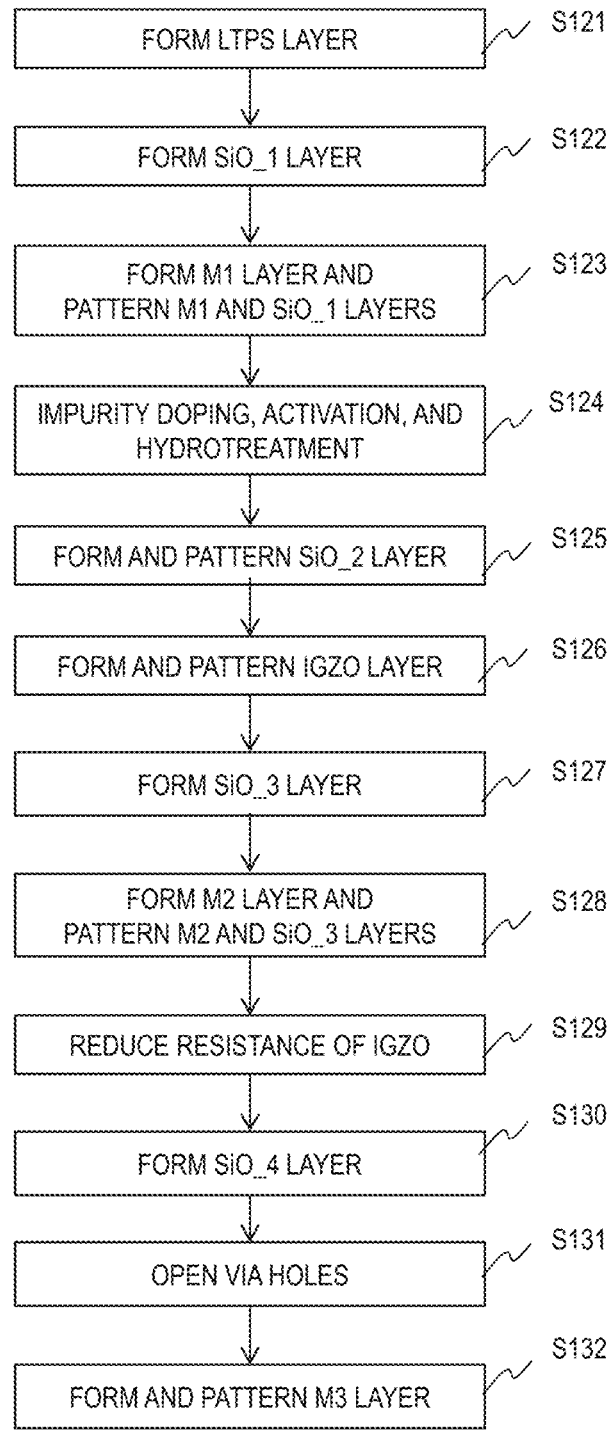
FIG. 8 is a flowchart of an example of a method of manufacturing the configuration example illustrated in FIG. 7.

FIG. 8 is a flowchart of an example of a method of manufacturing the configuration example illustrated in FIG. 7. The steps S121 to S124 are the same as the steps S101 to S104 in the flowchart of FIG. 4. After doping the low-temperature polysilicon layer with impurities, activating the impurities, and hydrotreating the low-temperature polysilicon layer (S124), the method forms a silicon oxide layer SiO_2 by CVD and patterns the silicon oxide layer SiO_2 by photolithography (S125). Next, the method forms an IGZO layer by sputtering and patterns the IGZO layer by photolithography (S126).

Next, the method forms a silicon oxide layer SiO_3 by CVD (S127), further forms a metal layer M2 by sputtering, and patterns the metal layer M2 and the silicon oxide layer SiO_3 together by photolithography (S128).

Next, the method reduces the resistance of the source/drain regions of the IGZO layer using the metal layer M2 (the gate 125) as a mask (S129). The resistance can be reduced by exposing the source/drain regions of the IGZO layer to He plasma. The resistance can also be reduced by implanting B, Ar, or H ions.

Next, the method forms a silicon oxide layer SiO_4 (S130). Next, the method opens via holes by anisotropic etching the silicon oxide layers SiO_2 and SiO_4 (S131). The step S132 is the same as the step S112 in the flowchart of FIG. 4.

As described above, this method patterns the IGZO layer after forming the interlayer insulating film 119 covering a part of the low-temperature polysilicon layer and the entire metal layer M1. In patterning the IGZO layer, the low-temperature polysilicon layer is covered with the interlayer insulating film 119 or the IGZO layer. The low-temperature polysilicon layer and the metal layer M1 are not exposed to etchant, so that the low-temperature polysilicon layer and the metal layer are free from the effect of the etchant.

Embodiment 3

Figure 9:
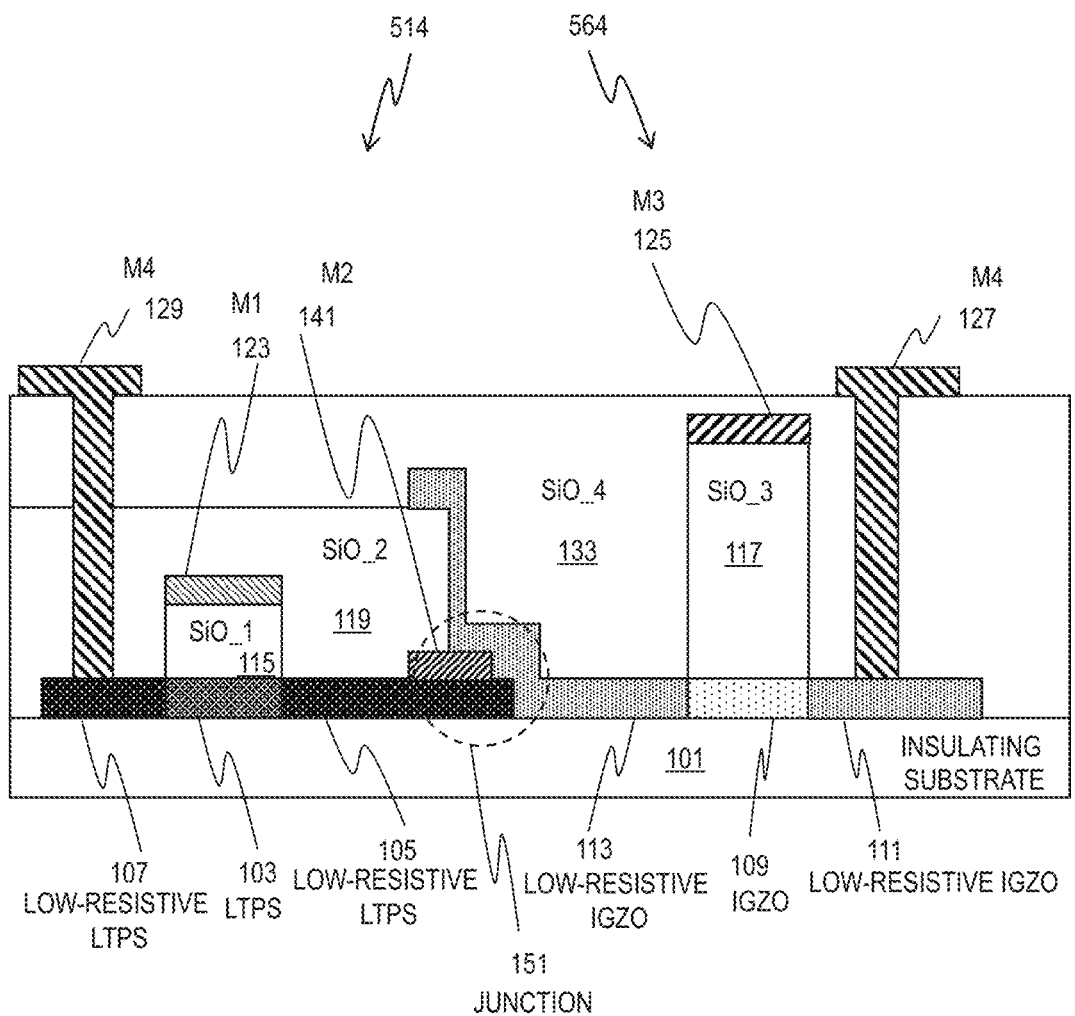
FIG. 9 illustrates cross-sectional structures of a low-temperature polysilicon TFT and an oxide semiconductor TFT whose sources/drains are connected with each other through a metal film.

A configuration example of a low-temperature polysilicon TFT and an oxide semiconductor TFT whose sources/drains are connected with each other through a metal film is described. FIG. 9 illustrates cross-sectional structures of a low-temperature polysilicon TFT 514 and an oxide semiconductor TFT 564 whose sources/drains are connected with each other through a metal film. In the following, differences from the configuration example illustrated in FIG. 7 are mainly described.

The junction 151 between the low-temperature polysilicon TFT 514 and the oxide semiconductor TFT 564 includes a metal film 141. The metal film 141 is included in a metal layer M2. The metal film 141 can be made of the same material or have the same structure as one of the gates 123, 125 and the electrodes 127, 129. The metal film 141 can be made of different material or have a different structure from any one of the gates 123, 125 and the electrodes 127, 129. The gate 125 of the oxide semiconductor TFT 564 is included in a metal layer M3. The electrodes 127 and 129 are included in a metal layer M4.

The metal film 141 is provided between the source/drain 105 (a part thereof) of the low-temperature polysilicon TFT 514 and the source/drain 113 (a part thereof) of the oxide semiconductor TFT 564 when seen in the layering direction, and is in contact with and interconnects them. The junction 151 has a laminate structure consisting of films of low-resistive LTPS, metal, and low-resistive IGZO. The metal film 141 ensures stable contact between the sources/drains 105 and 113.

Figure 10:
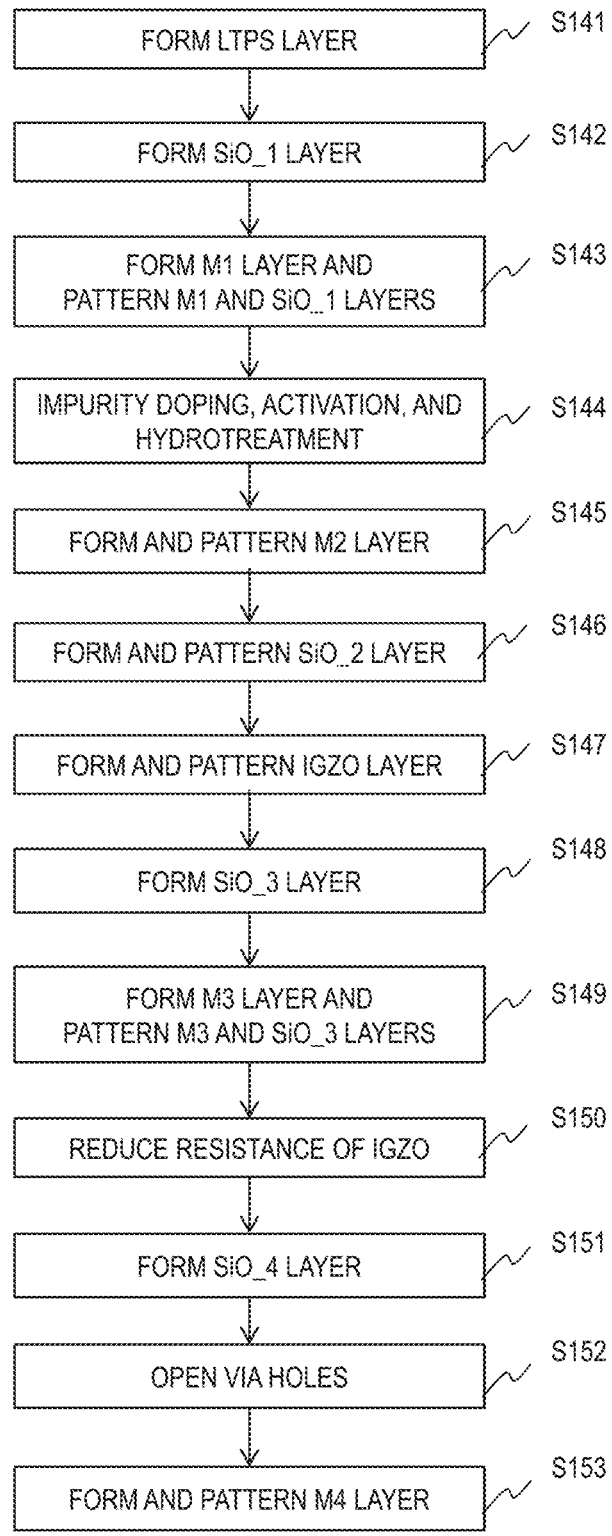
FIG. 10 is a flowchart of an example of a method of manufacturing the configuration example illustrated in FIG. 9.

FIG. 10 is a flowchart of an example of a method of manufacturing the configuration example illustrated in FIG. 9. The steps S141 to S144 are the same as the steps S121 to S124 in the flowchart of FIG. 8. At step S145, the method forms a metal layer M2 by sputtering and patterns the metal layer M2 by photolithography. Through these processes, the metal film 141 is prepared.

Next, the method forms a silicon oxide layer SiO_2 by CVD and patterns the silicon oxide layer SiO_2 by photolithography (S146). Next, the method forms an IGZO layer by sputtering and patterns the IGZO layer by photolithography (S147).

Next, the method forms a silicon oxide layer SiO_3 by CVD (S148), further forms a metal layer M3 by sputtering, and patterns the metal layer M3 and the silicon oxide layer SiO_3 together by photolithography (S149).

Next, the method reduces the resistance of the source/drain regions of the IGZO layer using the metal layer M3 (the gate 125) as a mask (S150). The resistance can be reduced by exposing the source/drain regions of the IGZO layer to He plasma. The resistance can also be reduced by implanting B, Ar, or H ions. Next, the method forms a silicon oxide layer SiO_4 (S151). Next, the method opens via holes by anisotropic etching the silicon oxide layers SiO_2 and SiO_4 (S152).

Next, the method forms a metal layer M4 by sputtering and patterns the metal layer M4 by photolithography (S153). For example, the metal layer M4 can be formed by depositing and patterning conductive films of Ti/Al/Ti, for example. The metal layer M4 can have a single layer structure or be made of metals different from these metals. The metal layer M4 includes electrodes 127 and 129 and further, vias (the inner parts coating or filling the via holes) for connecting the electrodes 127 and 129 to the source/drain 111 of the oxide semiconductor TFT and the source/drain 107 of the low-temperature polysilicon TFT.

Embodiment 4

Configuration examples of a low-temperature polysilicon TFT and an oxide semiconductor TFT whose sources/drains are connected with each other through a via are described. The semiconductor film of one of the low-temperature polysilicon TFT and the oxide semiconductor TFT is disposed upper than the semiconductor film of the other TFT and the parts overlapping each other when seen in the layering direction are connected by a via passing through the insulating film therebetween. The via is made of the semiconductor of the upper semiconductor film. In the following, examples such that the oxide semiconductor film is disposed in the upper layer are described.

Figure 11A:
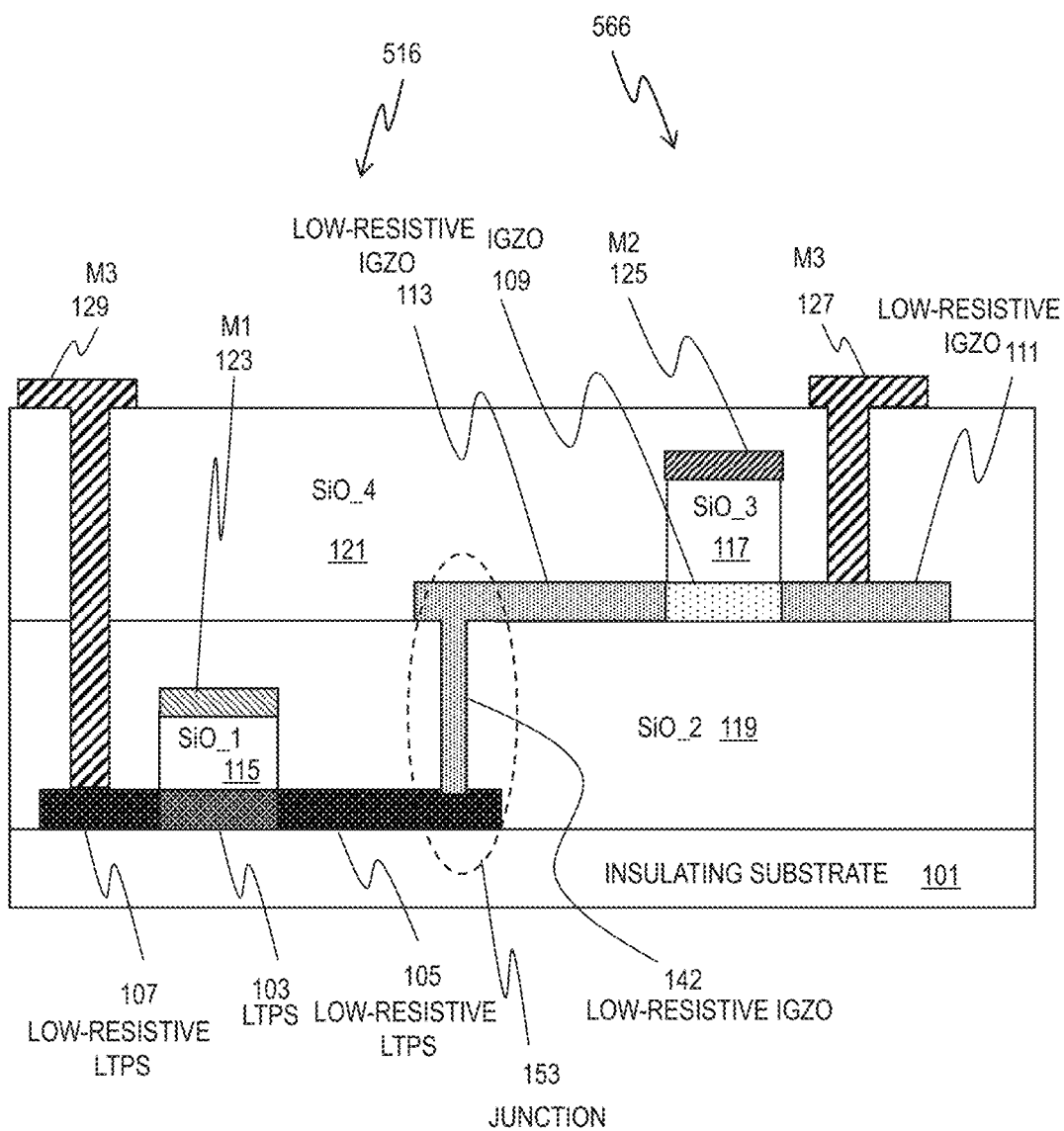
FIG. 11A illustrates cross-sectional structures of a low-temperature polysilicon TFT and an oxide semiconductor TFT whose sources/drains are connected with each other through a via.

FIG. 11A illustrates cross-sectional structures of a low-temperature polysilicon TFT 516 and an oxide semiconductor TFT 566 whose sources/drains are connected with each other through a via. In the following, differences from the configuration example illustrated in FIG. 3 are mainly described. In the configuration example in FIG. 3, the low-temperature polysilicon layer and the IGZO layer (oxide semiconductor layer) are formed on the same insulating layer (insulating substrate 101). In the example illustrated in FIG. 11A, these layers are formed on different insulating layers.

The junction 153 between the low-temperature polysilicon TFT 516 and the oxide semiconductor TFT 566 includes a via 142 passing through an interlayer insulating film 119. The via 142 is made of low-resistive IGZO. The source/drain 111 and 113 and the channel 109 of the oxide semiconductor TFT 566 are formed on the interlayer insulating film 119. The source/drain 113 of the oxide semiconductor TFT 566 and the source/drain 105 of the low-temperature polysilicon TFT 516 are connected by the via 142.

When seen in the layering direction, the via 142 is in contact with and interconnects the source/drain 105 (a part thereof) of the low-temperature polysilicon TFT 516 and the source/drain 113 (a part thereof) of the oxide semiconductor TFT 566. The part (first part) of the source/drain 105 of the low-temperature polysilicon TFT 516, the part (second part) of the source/drain 113 of the oxide semiconductor TFT 566, and the via 142 overlap one another when seen in the layering direction.

The gate insulating film 117 of the oxide semiconductor TFT 566 is included in a silicon oxide layer SiO_3. An interlayer insulating film 121 covering the oxide semiconductor TFT 566 and a silicon oxide layer SiO_2 covering the low-temperature polysilicon TFT 516 is included in a silicon oxide layer SiO_4.

Figure 12A:
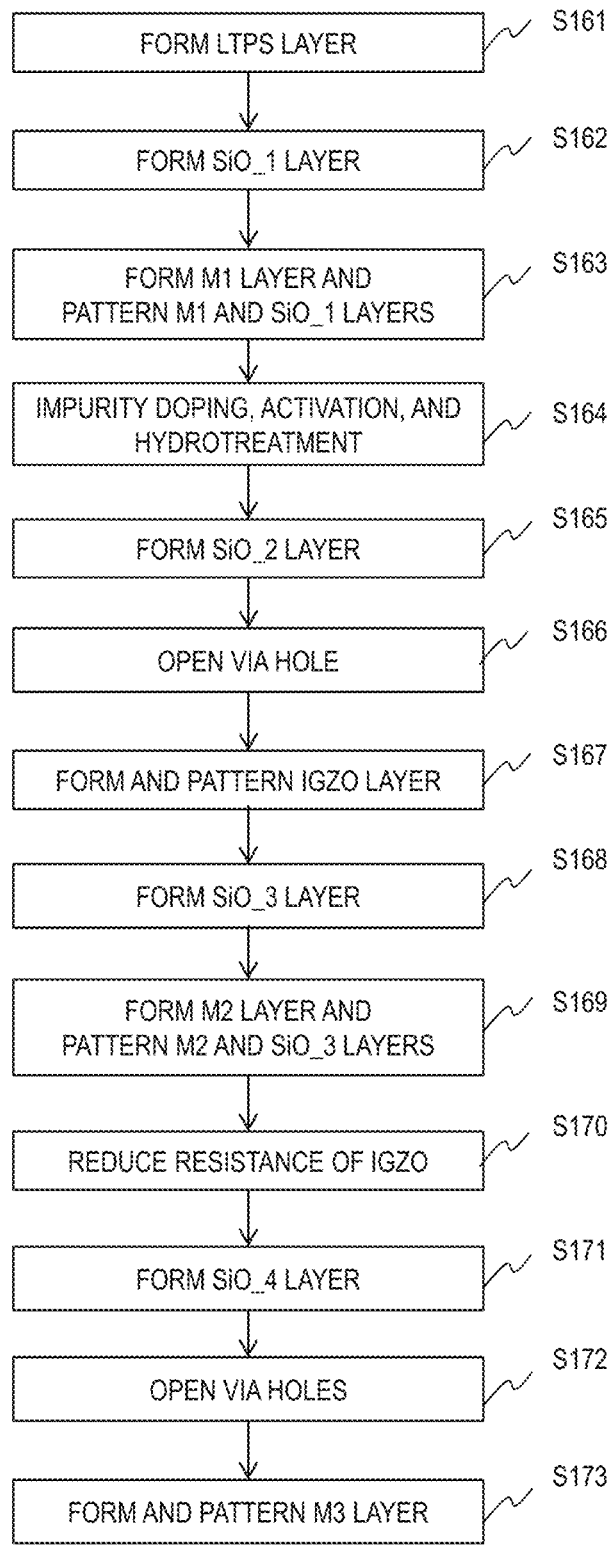
FIG. 12A is a flowchart of an example of a method of manufacturing the configuration example illustrated in FIG. 11A.

FIG. 12A is a flowchart of an example of a method of manufacturing the configuration example illustrated in FIG. 11A. The steps S161 to S164 are the same as the steps S101 to S104 in the flowchart of FIG. 4. After the step S164, the method forms a silicon oxide layer SiO_2 by CVD (S165). Next, the method opens a via hole for a junction 153 in the silicon oxide layer SiO_2 by anisotropic etching (S166).

Next, the method forms an IGZO layer by sputtering and patterns the IGZO layer by photolithography (S167). The IGZO layer includes an IGZO film of the oxide semiconductor TFT 566 and the inner part coating or filling the via hole for the junction 153. Next, the method forms a silicon oxide layer SiO_3 by CVD (S168), further forms a metal layer M2 by sputtering, and patterns the metal layer M2 and the silicon oxide layer SiO_3 together by photolithography (S169).

Next, the method reduces the resistance of the source/drain regions of the IGZO layer using the metal layer M2 (the gate 125) as a mask (S170). The resistance can be reduced by exposing the source/drain regions of the IGZO layer to He plasma. The resistance can also be reduced by implanting B, Ar, or H ions. This process reduces the resistance of the via 142, in addition to the resistance of the source/drain 111 and 113.

Next, the method forms a silicon oxide layer SiO_4 by CVD (S171). Next, the method opens via holes by anisotropic etching the silicon oxide layers SiO_2 and SiO_4 (S172).

Next, the method forms a metal layer M3 by sputtering and patterns the metal layer M3 by photolithography (S173). For example, the metal layer M3 can be formed by depositing and patterning conductive films of Ti/Al/Ti, for example. The metal layer M3 can have a single layer structure or be made of metals different from these metals. The metal layer M3 includes electrodes 127 and 129 and further, vias (the inner parts coating or filling the via holes) for connecting the electrodes 127 and 129 to the source/drain 111 of the oxide semiconductor TFT and the source/drain 107 of the low-temperature polysilicon TFT.

Figure 11B:
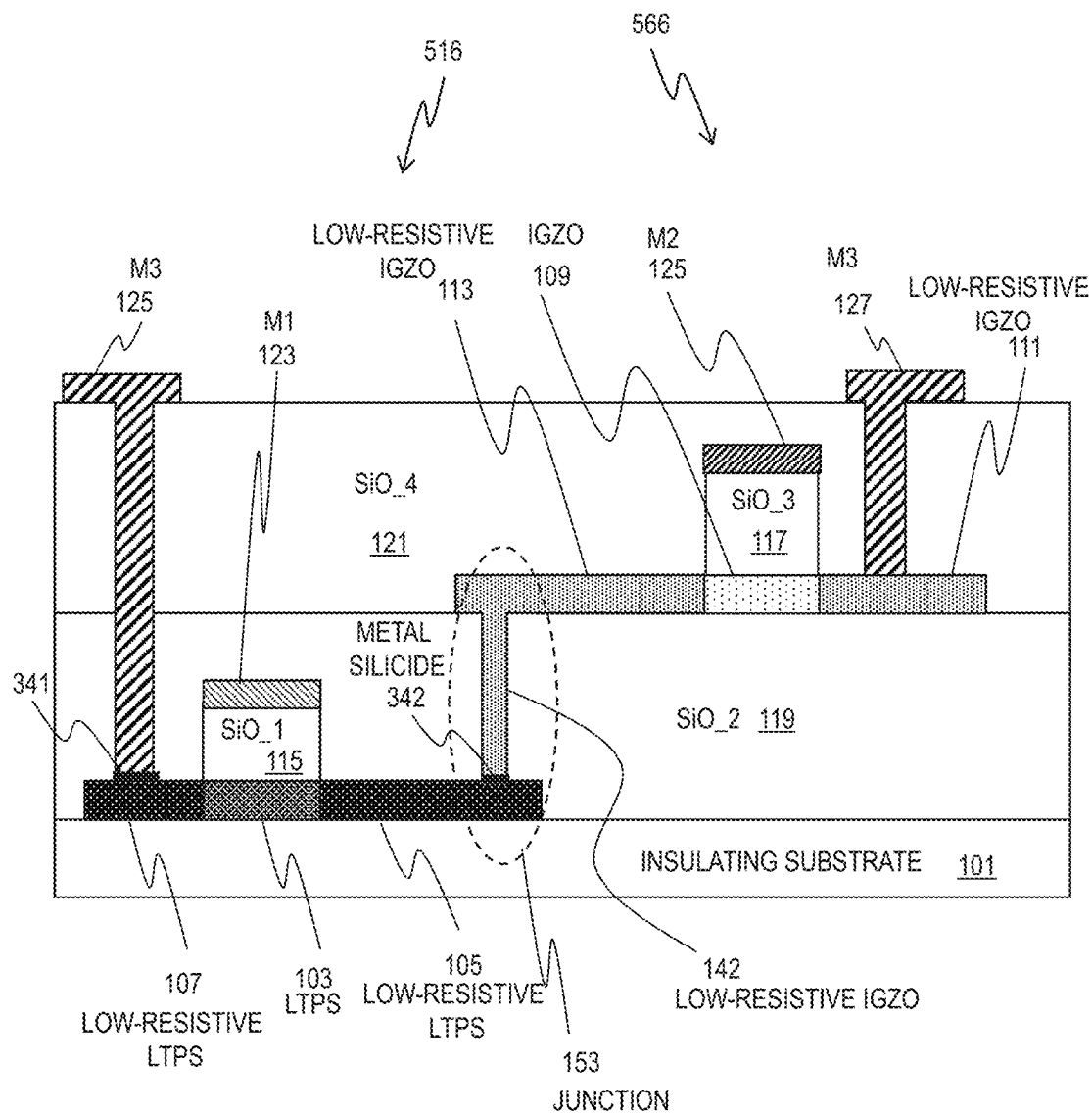
FIG. 11B illustrates other cross-sectional structures of a low-temperature polysilicon TFT and an oxide semiconductor TFT whose sources/drains are connected with each other through a via.

FIG. 11B illustrates other cross-sectional structures of a low-temperature polysilicon TFT and an oxide semiconductor TFT whose sources/drains are connected with each other through a via. In the following, differences from the configuration example illustrated in FIG. 11A are mainly described. In the configuration example in FIG. 11B, metal silicide films 341 and 342 are provided at the interfaces in the via holes between a low-resistive LTPS part and a metal part and between a low-resistive LTPS part and a low-resistive IGZO part.

The metal silicide film reduces the contact resistance at the interface between the low-resistive LTPS part and the low-resistive IGZO part. The metal silicide films can be a layer of a mixture of at least one of indium, gallium, and zinc elements of the constituent elements of the low-resistive IGZO, silicon element, and a metallic element. The metallic element can be molybdenum or titanium.

Figure 12B:
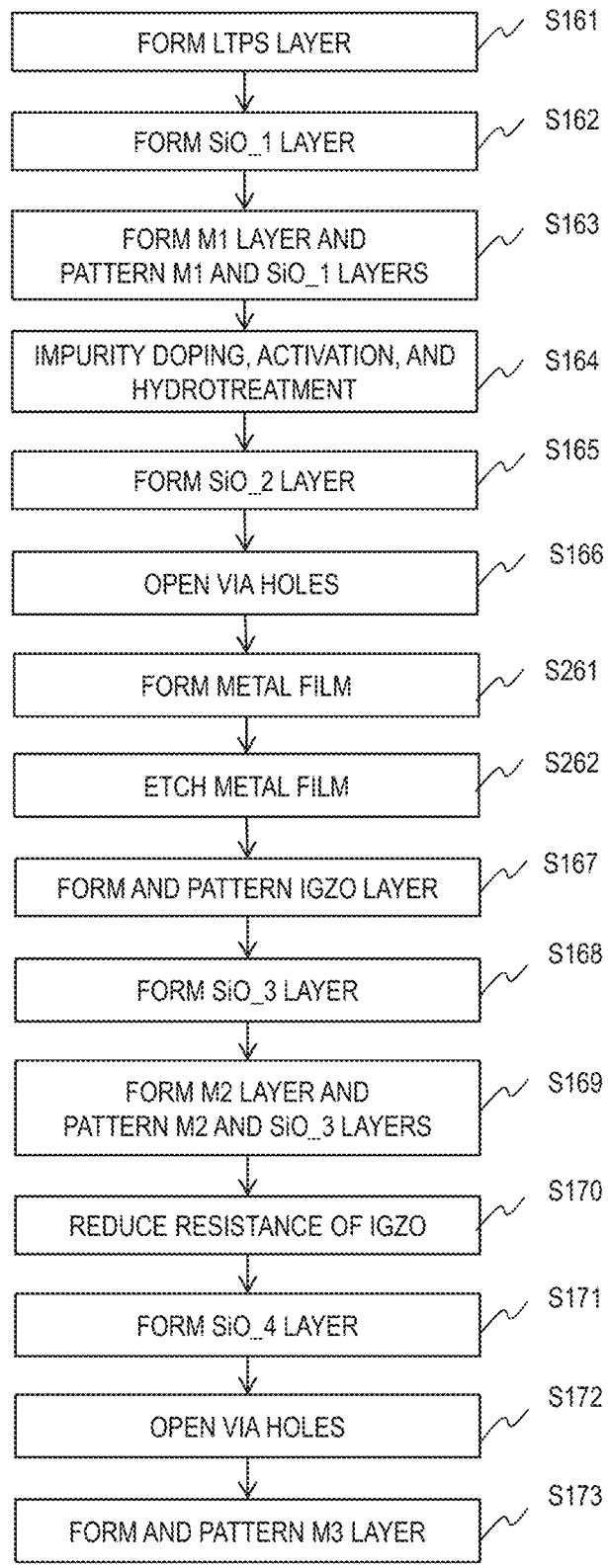
FIG. 12B is a flowchart of an example of a method of manufacturing the configuration example illustrated in FIG. 11B.

FIG. 12B is a flowchart of an example of a method of manufacturing the configuration example illustrated in FIG. 11B. After the steps S161 to S166 substantially same as those in FIG. 12A, the method forms a metal layer by sputtering (S261). This metal film can be a molybdenum or titanium film. In forming this metal film, interfacial reaction produces metal silicide films at the interfaces between the low-resistive LTPS and the metal film in the via holes. The interfacial reaction can be accelerated by annealing the metal film at approximately 200° C. to 300° C. to enhance the formation of the metal silicide films.

Next, the method removes the metal film by wet etching (S262). After the etching, the metal silicide films remain on the surface of the low-resistive LTPS in the via holes. Subsequently, the method performs substantially the same steps as the steps following the step S167 in FIG. 12A. Other than being annealed at approximately 200° C. to 300° C., the TFT substrate may experience temperature history of about 200° C. to 300° C., for example when a SiO film is formed thereon. The formation of the metal silicide is enhanced under the high temperature.

Through the above-described manufacturing method, a metal silicide film is produced at the interface between the low-resistive LTPS part and the low-resistive IGZO part in the via hole. This metal silicide further reduces the contact resistance at the interface between the low-resistive LTPS part and the low-resistive IGZO part. The metal silicide film can be a layer of a mixture of at least one of indium, gallium, and zinc elements of the constituent elements of the low-resistive IGZO, silicon element, and a metallic element. The metallic element can be molybdenum or titanium. This configuration such that a metal silicide film is provided at the interface between a low-resistive LTPS part and a low-resistive IGZO part is applicable to not only the configuration illustrated in FIG. 11B but also all configurations described in this specification.

Figure 13:
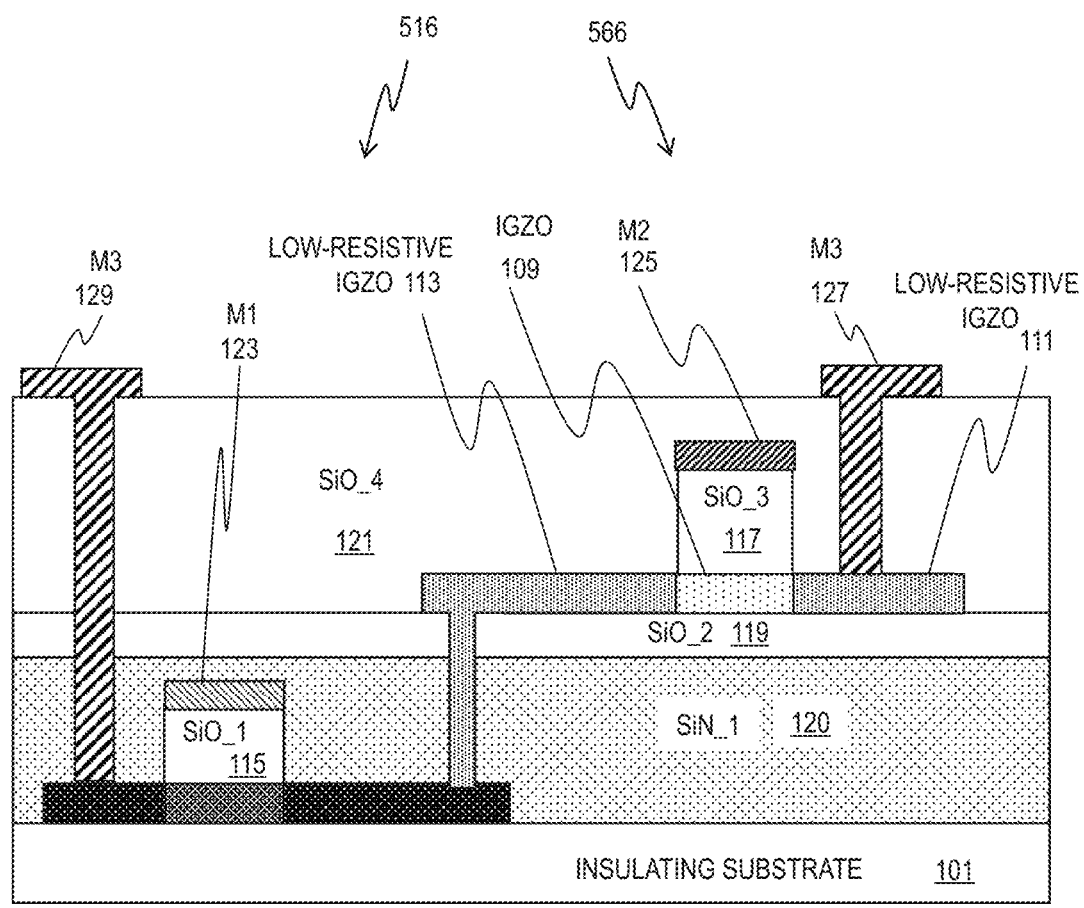
FIG. 13 illustrates cross-sectional structures of a low-temperature polysilicon TFT and an oxide semiconductor TFT whose sources/drains are connected with each other through a via.

Still another configuration example of a low-temperature polysilicon TFT and an oxide semiconductor TFT whose sources/drains are connected with each other through a via is described. FIG. 13 illustrates cross-sectional structures of a low-temperature polysilicon TFT 516 and an oxide semiconductor TFT 566 whose sources/drains are connected with each other through a via.

In this configuration example, an interlayer insulating film has a multi-layer structure. The difference from the configuration example illustrated in FIG. 11A is that the interlayer insulating film consists of a lower film 120 and an upper film 119 from the bottom (from the side closer to the insulating substrate 101). The lower film 120 is included in a silicon nitride layer SiN_1 and the upper film 119 is included in a silicon oxide layer SiO_2.

Figure 14:
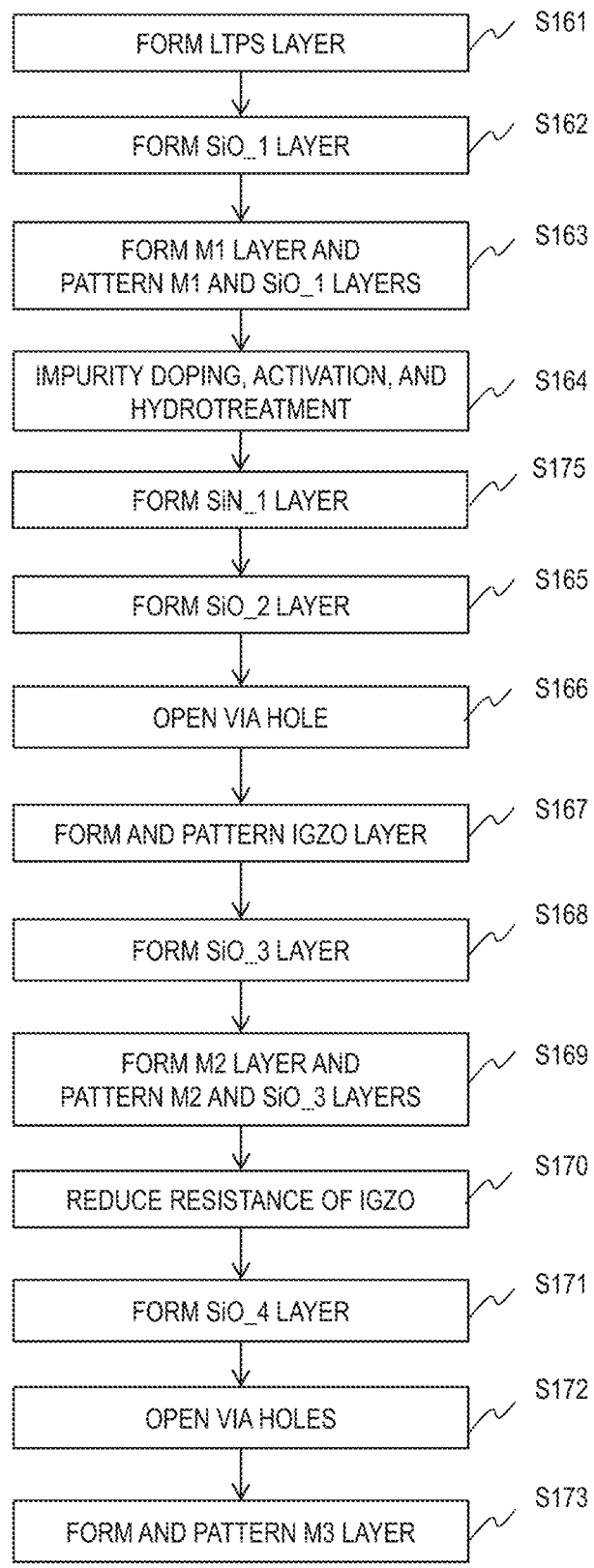
FIG. 14 is a flowchart of an example of a method of manufacturing the configuration example illustrated in FIG. 13.

FIG. 14 is a flowchart of an example of a method of manufacturing the configuration example illustrated in FIG. 13. The difference from the flowchart of FIG. 12A is that a step S175 of forming a silicon nitride layer SiN_1 is added before the step S165 of forming a silicon oxide layer SiO_2. Through this process, the interlayer insulating film can have a laminate structure such that two layers of a silicon nitride layer SiN_1 and a silicon oxide layer SiO_2 are laminated in this order.

Figure 15:
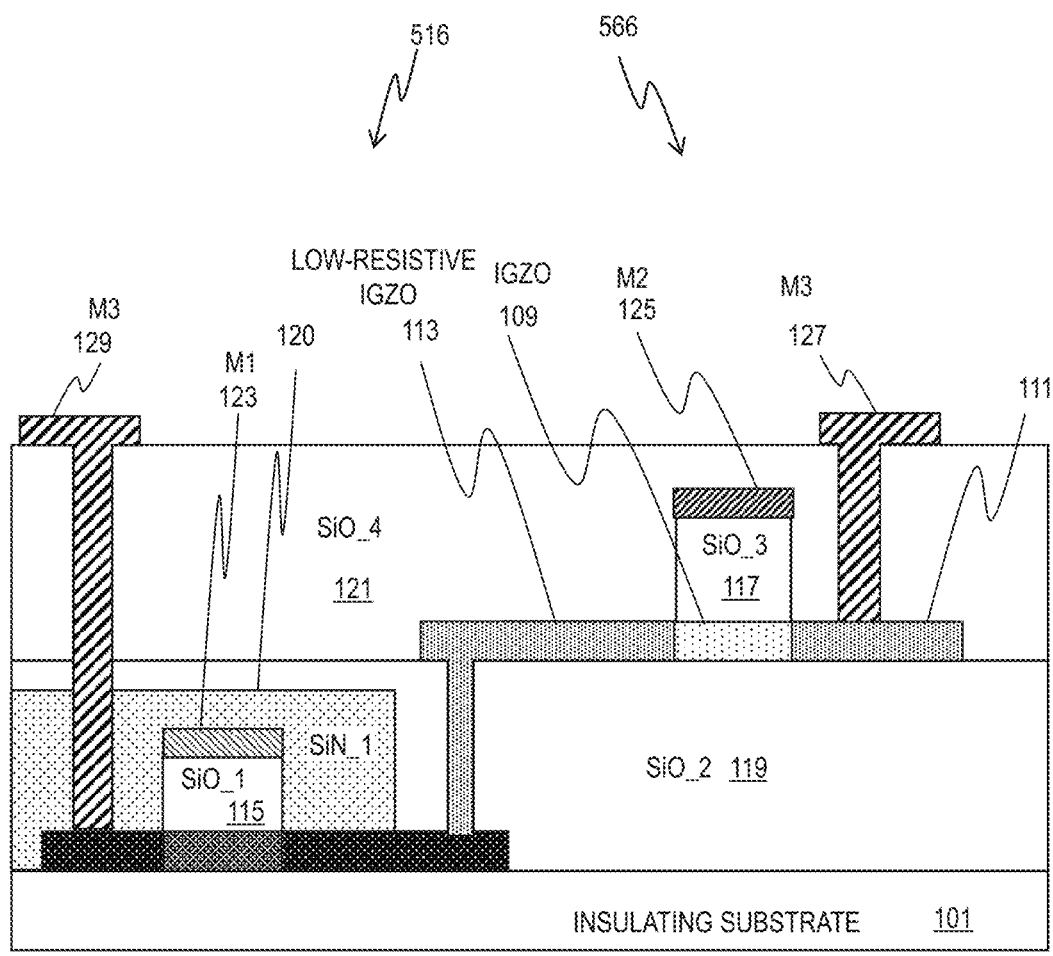
FIG. 15 illustrates cross-sectional structures of a low-temperature polysilicon TFT and an oxide semiconductor TFT whose sources/drains are connected with each other through a via.

Still another configuration example of a low-temperature polysilicon TFT and an oxide semiconductor TFT whose sources/drains are connected with each other through a via is described. FIG. 15 illustrates cross-sectional structures of a low-temperature polysilicon TFT 516 and an oxide semiconductor TFT 566 whose sources/drains are connected with each other through a via.

In this configuration example, the interlayer insulating film has a multi-layer structure. The difference from the configuration example illustrated in FIG. 13 is that the lower film 120 of the silicon nitride layer SiN_1 is patterned into a shape that covers the gate 123 of the low-temperature polysilicon TFT 516.

Figure 16:
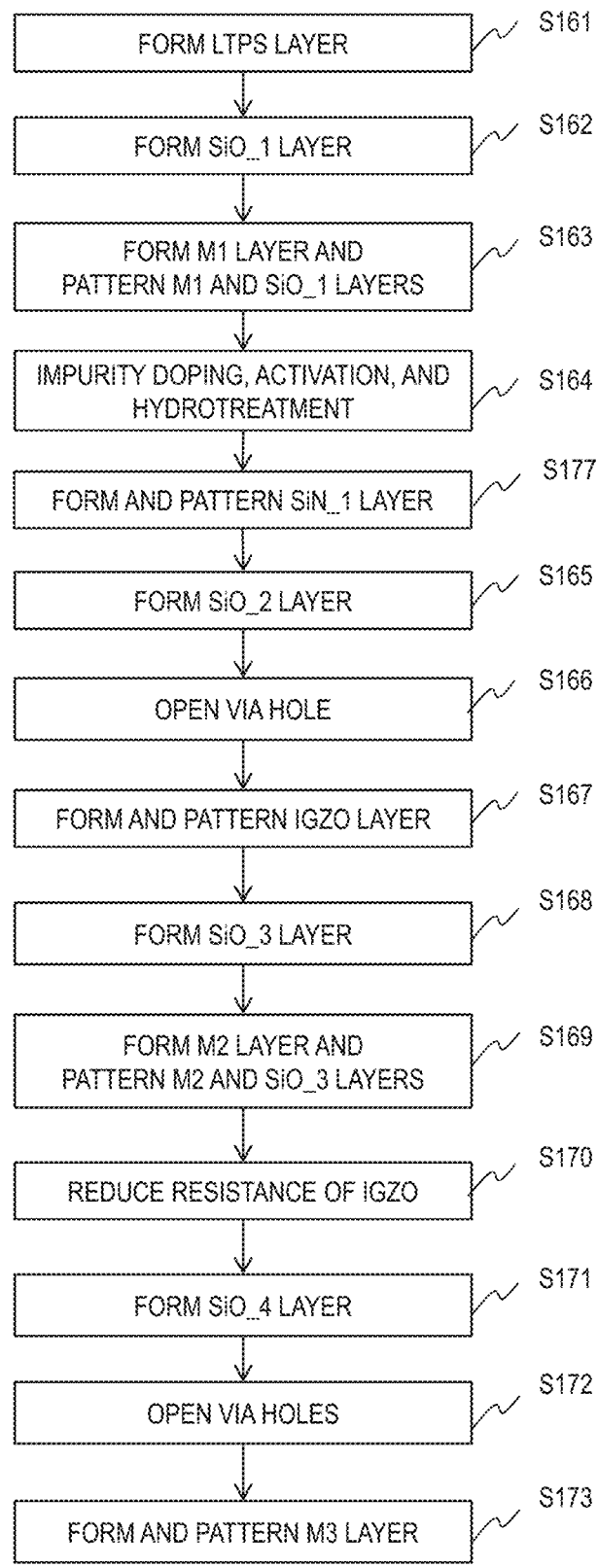
FIG. 16 is a flowchart of an example of a method of manufacturing the configuration example illustrated in FIG. 15.

FIG. 16 is a flowchart of an example of a method of manufacturing the configuration example illustrated in FIG.

15. The difference from the flowchart of FIG. 12A is that a step S177 of forming and patterning a silicon nitride layer SiN_1 is added before the step S165 of forming a silicon oxide layer SiO_2. Through this process, the interlayer insulating film can have a structure such that the lower film of the interlayer insulating film is patterned to a shape that covers the gate 123 of the low-temperature polysilicon TFT 516.

Although not shown in the drawings, the interlayer insulating film can have a structure such that three layers of a silicon oxide layer, a silicon nitride layer, and a silicon oxide layer are laminated in this order from the bottom (from the side closer to the insulating substrate 101) or two layers of a silicon oxide film and a silicon nitride film are laminated in this order.

In the foregoing configuration examples, the low-temperature polysilicon layer and the oxide semiconductor layer are formed on different insulating layers. The characteristics of the low-temperature polysilicon TFT and the oxide semiconductor TFT can be controlled separately by controlling the thicknesses of these layers. Further, a storage capacitor can be configured with the low-resistive polysilicon film, the low-resistive oxide semiconductor film, and an insulating film therebetween.

Embodiment 5

Figure 17:
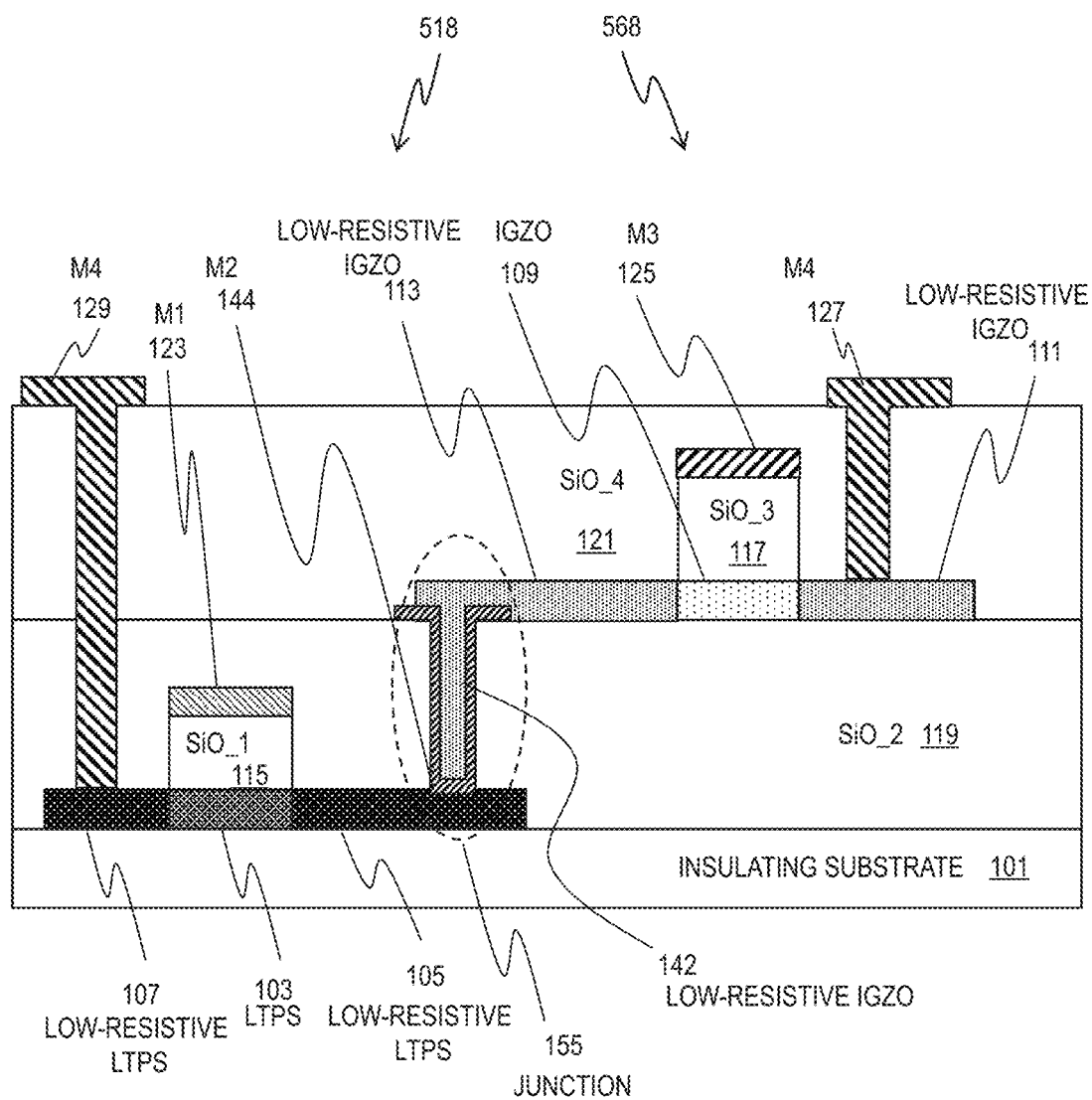
FIG. 17 illustrates cross-sectional structures of a low-temperature polysilicon TFT and an oxide semiconductor TFT whose sources/drains are connected with each other through a laminate of a via and a metal film.

A configuration example of a low-temperature polysilicon TFT and an oxide semiconductor TFT whose sources/drains are connected with each other through a laminate of a via and a metal film is described. FIG. 17 illustrates cross-sectional structures of a low-temperature polysilicon TFT 518 and an oxide semiconductor TFT 568 whose sources/drains are connected with each other through a laminate of a via and a metal film. In the following, differences from the configuration example illustrated in FIG. 11A are mainly described.

A junction 155 between the low-temperature polysilicon TFT 518 and the oxide semiconductor TFT 568 includes a metal film 144. The metal film 144 is included in a metal layer M2. The metal film 144 can be made of the same material or have the same structure as one of the gates 123, 125 and the electrodes 127, 129. The metal film 144 can be made of different material or have a different structure from any one of the gates 123, 125 and the electrodes 127, 129. The gate 125 of the oxide semiconductor TFT 568 is included in a metal layer M3. The electrodes 127 and 129 are included in a metal layer M4.

The metal layer 144 is provided between the source/drain 105 (a part thereof) of the low-temperature polysilicon TFT 518 and the via 142 when seen in the layering direction, and is in contact with and interconnects them. The junction 155 has a laminate structure consisting of films of low-resistive LTPS, metal, and low-resistive IGZO. The metal film 144 ensures stable contact between the source/drain 105 and the via 142.

Figure 18:
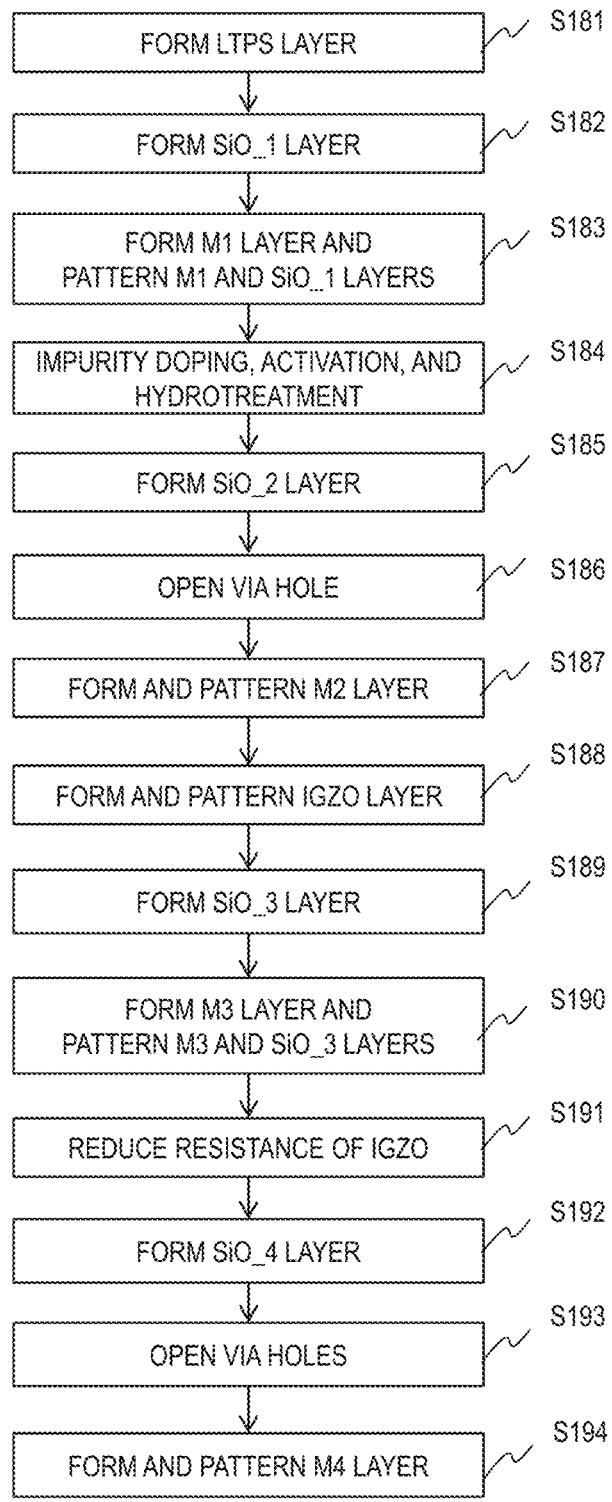
FIG. 18 is a flowchart of an example of a method of manufacturing the configuration example illustrated in FIG. 17.

FIG. 18 is a flowchart of an example of a method of manufacturing the configuration example illustrated in FIG. 17. The steps S181 to S186 are the same as the steps S161 to S166 in the flowchart of FIG. 12A. After the step S186, the method forms a metal layer M2 by sputtering and patterns the metal layer M2 by photolithography (S187). Through these processes, a metal film 144 is prepared in the via hole.

Next, the method forms an IGZO layer by sputtering and patterns the IGZO layer by photolithography (S188). The IGZO layer includes an IGZO film of the oxide semiconductor TFT 568 and the inner part coating or filling the via hole for the junction 155. Next, the method forms a silicon oxide layer SiO_3 by CVD (S189), further forms a metal layer M3 by sputtering, and patterns the metal layer M3 and the silicon oxide layer SiO_3 together by photolithography (S190).

Next, the method reduces the resistance of the source/drain regions of the IGZO layer using the metal layer M3 (the gate 125) as a mask (S191). The resistance can be reduced by exposing the source/drain regions of the IGZO layer to He plasma. The resistance can also be reduced by implanting B, Ar, or H ions. This process reduces the resistance of the via 142, in addition to the resistance of the source/drain 111 and 113.

Next, the method forms a silicon oxide layer SiO_4 by CVD (S192). Next, the method opens via holes by anisotropic etching the silicon oxide layers SiO_2 and SiO_4 (S193).

Next, the method forms a metal layer M4 by sputtering and patterns the metal layer M4 by photolithography (S194). For example, the metal layer M4 can be formed by depositing and patterning conductive films of Ti/Al/Ti, for example. The metal layer M4 can have a single layer structure or be made of metals different from these metals. The metal layer M4 includes electrodes 127 and 129 and further, vias (the inner parts coating or filling the via holes) for connecting the electrodes 127 and 129 to the source/drain 111 of the oxide semiconductor TFT and the source/drain 107 of the low-temperature polysilicon TFT.

Embodiment 6

The foregoing embodiments have described configurations of a low-temperature polysilicon TFT and an oxide semiconductor TFT whose sources/drains are connected with each other through a via. In contrast to those configurations, a low-resistive IGZO part 352 in a via hole connected with low-resistive LTPS and a low-resistive IGZO part 351 corresponding to a source/drain of the oxide semiconductor TFT can be formed as separate patterns without being continued to each other. The low-resistive IGZO parts 351 and 352 are interconnected by an electrode 353 of a metal layer M3.

Common low-temperature polysilicon TFTs employ a silicon nitride film (formed by plasma CVD) as an interlayer insulating film because the silicon nitride film includes sufficient hydrogen for neutralizing dangling bond defects in polysilicon. The silicon nitride film includes hydrogen of 20 to 30% in atomic density; this hydrogen diffuses down into the polysilicon and bonds to the dangling bonds to neutralize the defects.

Meanwhile, this hydrogen diffuses into the low-resistive IGZO in contact with low-temperature polysilicon in a via hole. If the low-resistive IGZO in contact with low-resistive LTPS in a via hole is continued to the low-resistive IGZO of the source/drain of the oxide semiconductor TFT as illustrated in FIG. 13, hydrogen diffused in the low-resistive IGZO in the via hole may diffuse into the low-resistive IGZO of the source/drain and further, into the IGZO of the channel.

Figure 19:
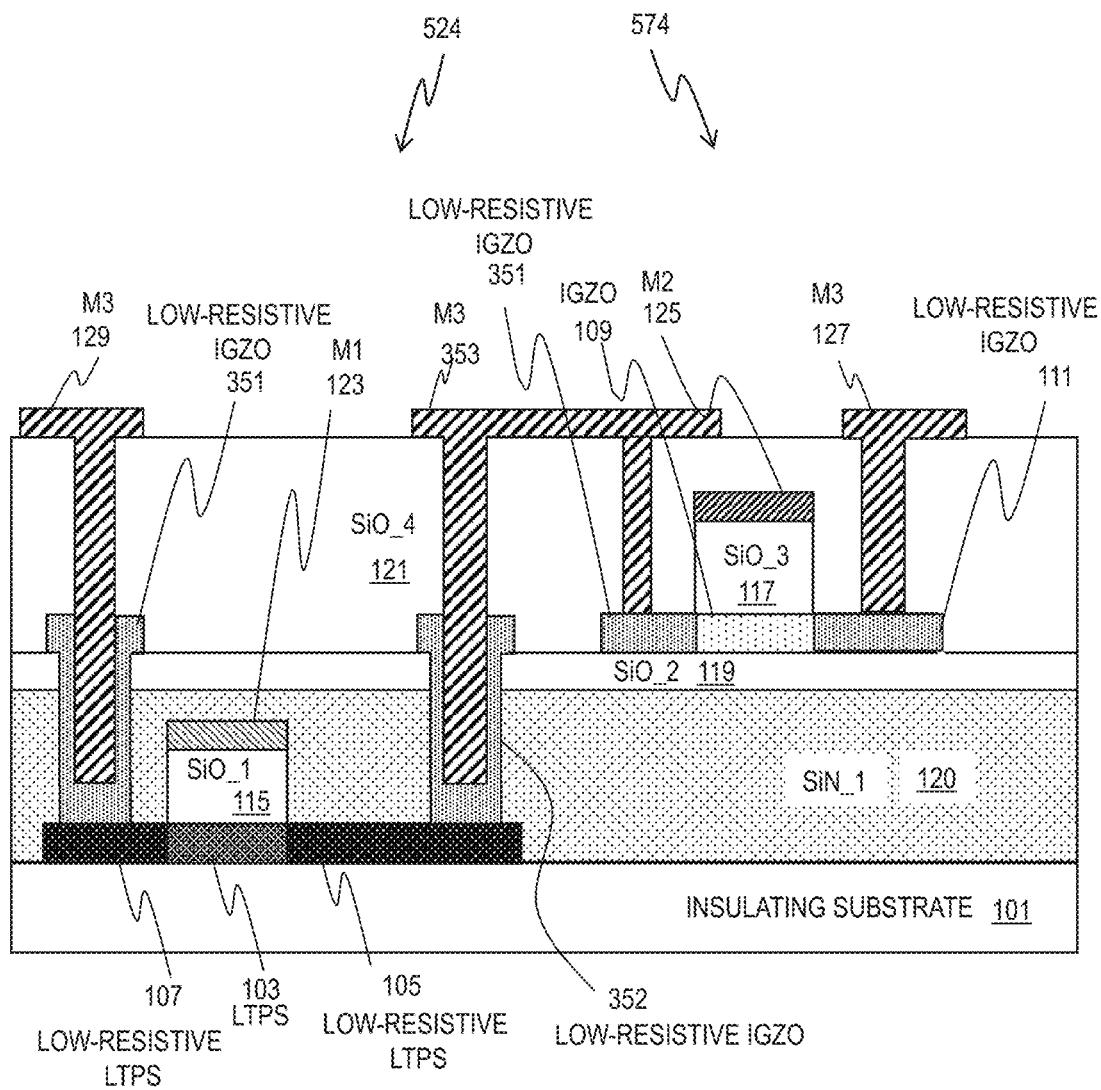
FIG. 19 illustrates cross-sectional structures of a low-temperature polysilicon TFT and an oxide semiconductor TFT whose sources/drains are connected with each other through a via.

In such a case, the resistance of the IGZO of the channel could be reduced to impair the function of the TFT (the TFT may not be turned off). In the configuration of FIG. 19, however, the low-resistive IGZO part 352 connected with low-resistive LTPS in a via hole is separate from the low-resistive IGZO part 351 corresponding to a source/drain of the oxide semiconductor TFT; accordingly, hydrogen does not diffuse into IGZO of the channel to achieve reliable TFT operation.

Figure 20:
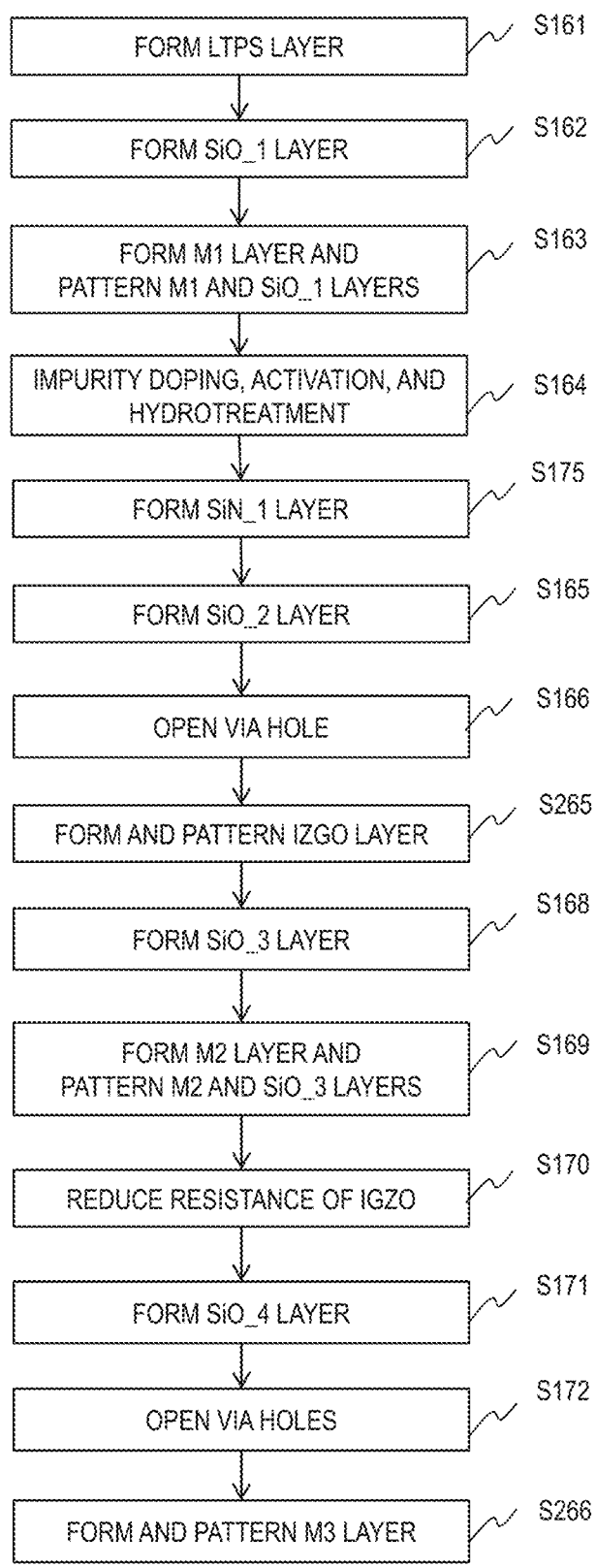
FIG. 20 is a flowchart of an example of a method of manufacturing the configuration example illustrated in FIG. 19.

FIG. 20 is a flowchart of an example of a method of manufacturing the configuration example illustrated in FIG. 19. The steps S161 to S166 are as described with reference to the flowchart of FIG. 14. After the step S166, the method forms an IGZO film and patterns the IGZO film by photolithography (S265). In this process, the IGZO film to be connected with LTPS in a via hole and the IGZO film to be a source/drain of the oxide semiconductor TFT are formed as separate patterns. Thereafter, the method performs the same processes as the steps S168 to S172 in the flowchart of FIG. 14.

Next, the method forms a metal layer M3 by sputtering and patterns the metal layer M3 by photolithography (S266). For example, the metal layer M3 can be formed by depositing and patterning conductive films of Ti/Al/Ti, for example. The metal layer M3 can have a single layer structure or be made of metals different from these metals. The electrode 353 of the metal layer M3 connects the low-resistive IGZO part 351 corresponding to a source/drain of the oxide semiconductor TFT and the low-resistive IGZO part 352 that is connected with the low-resistive LTPS of a source/drain of the low-temperature polysilicon TFT in a via hole.

Embodiment 7

Figure 21:
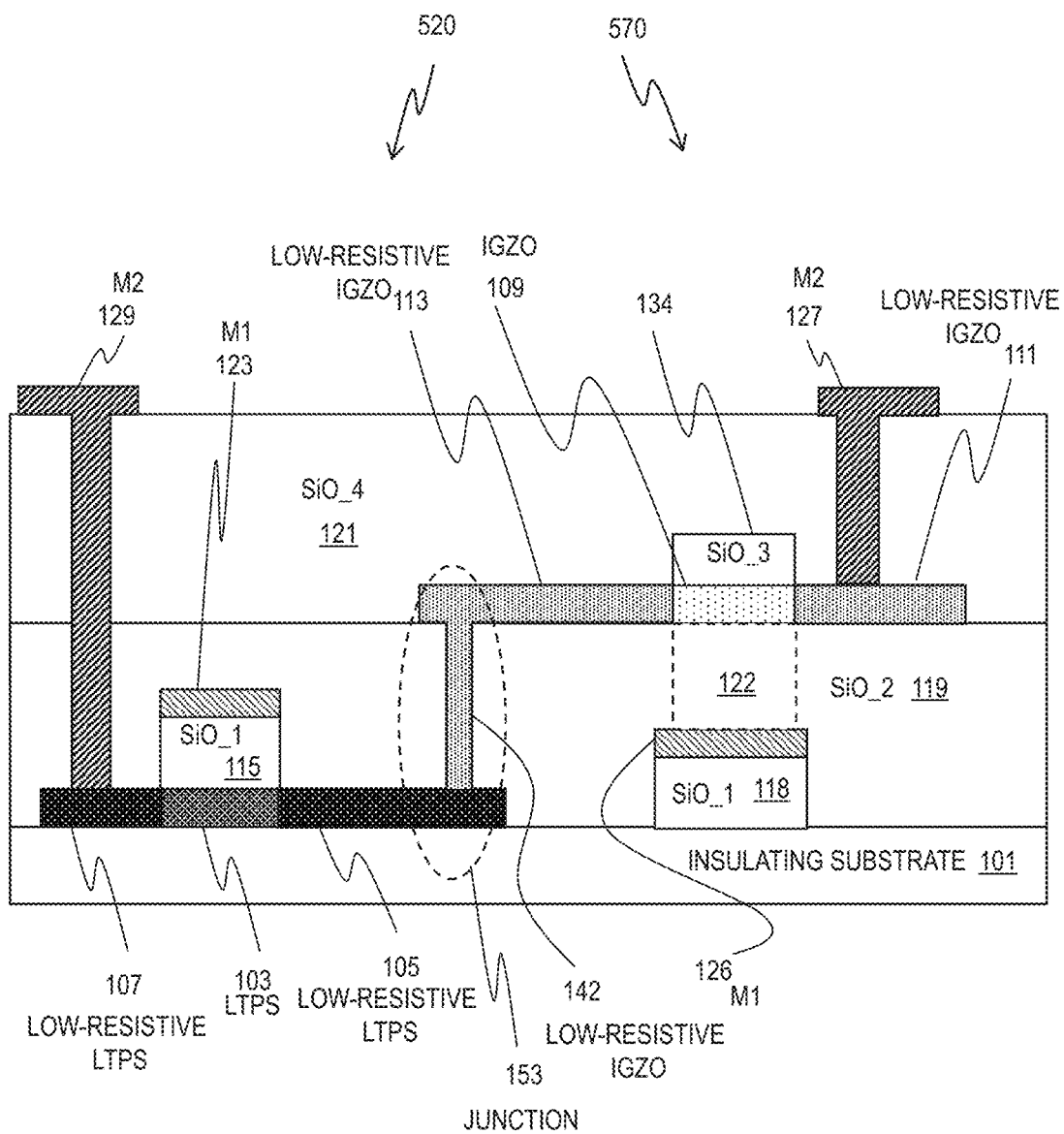
FIG. 21 illustrates cross-sectional structures of a low-temperature polysilicon TFT and an oxide semiconductor TFT whose sources/drains are connected with each other through a via.

Still another configuration example of a low-temperature polysilicon TFT and an oxide semiconductor TFT whose sources/drains are connected with each other through a via is described. FIG. 21 illustrates cross-sectional structures of a low-temperature polysilicon TFT 520 and an oxide semiconductor TFT 570 whose sources/drains are connected with each other through a via. In the following, differences from the configuration example illustrated in FIG. 11A are mainly described.

The oxide semiconductor TFT 570 has a bottom-gate structure. The gate 126 is provided above and in contact with an insulating film 118. The insulating film 118 is included in a silicon oxide layer SiO_1. The gate 126 is provided on a layer lower than the channel 109 in such a manner that the gate 126 and the channel 109 overlap when seen in the layering direction. The gate insulating film 122 between the gate 126 and the channel 109 is included in a silicon oxide layer SiO_2 together with an interlayer insulating film 119.

An insulating film 134 is provided on a layer upper than the channel 109 in such a manner that the insulating film 134 and the channel 109 overlap when seen in the layering direction. In the example of FIG. 21, the insulating film 134 covers and is in contact with the channel 109. The insulating film 134 works as a mask in the process to reduce the resistance to prepare the source/drain 111 and 113.

The gate 123 of the low-temperature polysilicon TFT 520 and the gate 126 of the oxide semiconductor TFT 570 are both included in a metal layer M1. The electrodes 127 and 129 are included in a metal layer M2.

Figure 22:
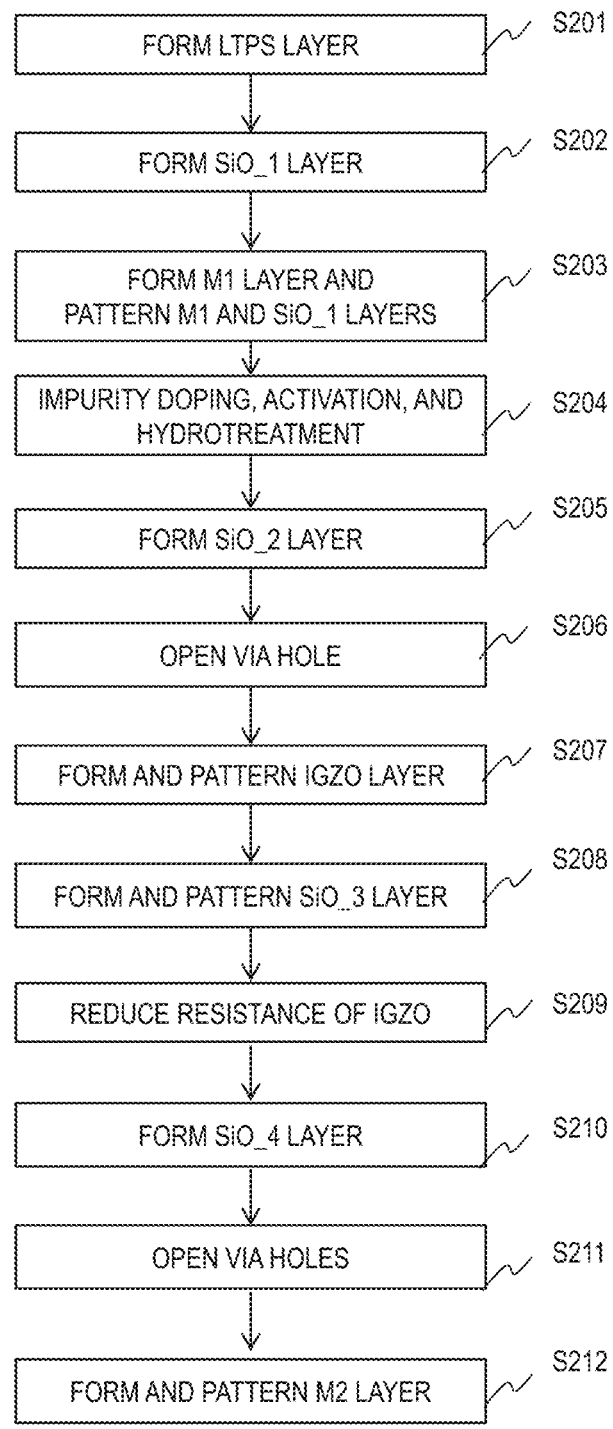
FIG. 22 is a flowchart of an example of a method of manufacturing the configuration example illustrated in FIG. 21.

FIG. 22 is a flowchart of an example of a method of manufacturing the configuration example illustrated in FIG. 21. The steps S201 and S202 are the same as the steps S181 and S182 in the flowchart of FIG. 18. After the step S202, the method forms a metal layer M1 by sputtering, and patterns the metal layer M1 and the silicon oxide layer SiO_1 together by photolithography (S203). Through these processes, the gate 123 and the gate insulating film 115 of the low-temperature polysilicon TFT 520 and the gate 126 and the insulating film 118 of the oxide semiconductor TFT 570 are prepared.

Next, the method dopes the source/drain regions of the polysilicon film with impurities using the gate 123 (the metal layer M1) as a mask and activates the impurities. Further, the method terminates the dangling bonds by hydrotreatment (S204). Next, the method forms a silicon oxide layer SiO_2 (S205).

Next, the method opens a via hole for a junction 153 in the silicon oxide layers SiO_2 by anisotropic etching (S206). Next, the method forms an IGZO layer by sputtering and patterns the IGZO layer by photolithography (S207). The IGZO layer includes the IGZO film of the oxide semiconductor TFT 570 and the inner part coating or filling the via hole for the junction 153.

Next, the method forms a silicon oxide layer SiO_3 and patterns the silicon oxide layer SiO_3 by photolithography (S208). Through these processes, an insulating film 134 is prepared on the oxide semiconductor film. Next, the method reduces the resistance of the source/drain regions of the IGZO layer using the insulating film 134 (the silicon oxide layer SiO_3) as a mask (S209). The resistance can be reduced by exposing the source/drain regions of the IGZO layer to He plasma or by implanting B, Ar, or H ions. This process reduces the resistance of the via 142, in addition to the resistance of the source/drain 111 and 113.

Next, the method forms a silicon oxide layer SiO_4 by CVD (S210). Next, the method opens via holes in the silicon oxide layers SiO_2 and SiO_4 by anisotropic etching (S211).

Next, the method forms a metal layer M2 by sputtering and patterns the metal layer M2 by photolithography (S212). For example, the metal layer M2 can be formed by depositing and patterning conductive films of Ti/Al/Ti, for example. The metal layer M2 can have a single layer structure or be made of metals different from these metals. The metal layer M2 includes electrodes 127 and 129 and further, vias (the inner parts coating or filling the via holes) for connecting the electrodes 127 and 129 to the source/drain 111 of the oxide semiconductor TFT and the source/drain 107 of the low-temperature polysilicon TFT.

Embodiment 8

Figure 23:
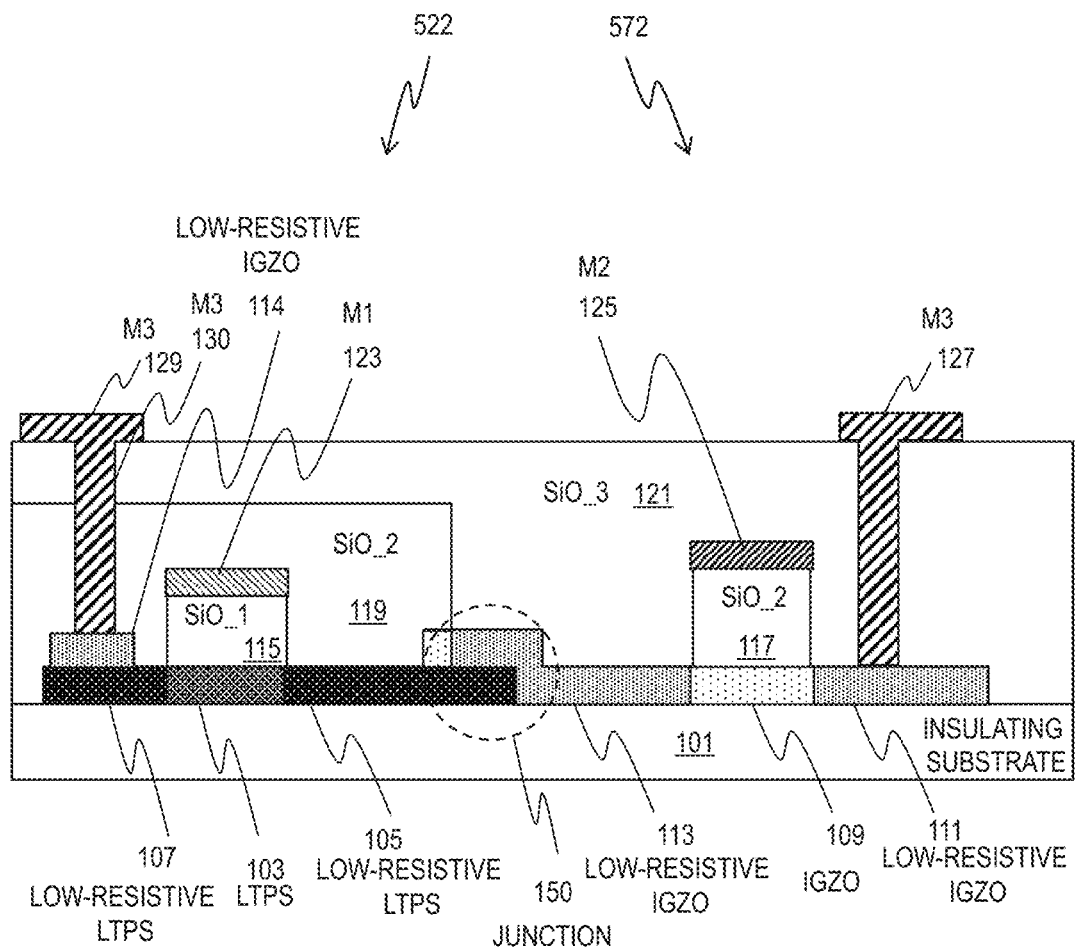
FIG. 23 illustrates cross-sectional structures of a low-temperature polysilicon TFT and an oxide semiconductor TFT whose sources/drains are in direct contact with each other.

Still another configuration example of a low-temperature polysilicon TFT and an oxide semiconductor TFT whose sources/drains are in direct contact with each other is described. FIG. 23 illustrates cross-sectional structures of a low-temperature polysilicon TFT 522 and an oxide semiconductor TFT 572 whose sources/drains are in direct contact with each other. In the following, differences from the configuration example illustrated in FIG. 3 are mainly described.

The configuration example in FIG. 23 includes a low-resistive IGZO film 114 between a source/drain 107 of the low-temperature polysilicon TFT 522 and a via 130. The low-resistive IGZO film 114 is on the same layer as the source/drain 111 and 113 of the oxide semiconductor TFT 572 and formed together with them in the same process. The low-resistive IGZO film 114 is located between the source/drain 107 (a part thereof) of the low-temperature polysilicon TFT 522 and the via 130 when seen in the layering direction, and is in contact with and interconnects them. The via 130 is provided to connect an electrode 129 and the source/drain 107 and is continued from the electrode 129.

In the case where the low-resistive IGZO film 114 is not provided, the manufacturing method may include a process of removing silicon oxide produced on the surface of the source/drain 107 of the low-temperature polysilicon TFT 522 with hydrofluoric acid (HF treatment) after opening via holes in the silicon oxide layers SiO_2 and SiO_3. In the HF treatment, the source/drain 111 of the oxide semiconductor TFT 572 is also exposed to the hydrofluoric acid. Since the tolerance of the oxide semiconductor to hydrofluoric acid is not high, the source/drain 111 could be etched.

The low-resistive IGZO film 114 in the configuration example in FIG. 23 eliminates the necessity of HF treatment. The source/drain 107 of the low-temperature polysilicon TFT 522 in the configuration example in FIG. 23 is not exposed to the via and covered with the low-resistive IGZO film 114. In forming a via hole in the silicon oxide layers SiO_2 and SiO_3, the low-resistive IGZO film 114 is contacted by the etchant but the source/drain 107 is not. Accordingly, the HF treatment to remove silicon oxide on the surface of the source/drain 107 can be eliminated.

Figure 24:
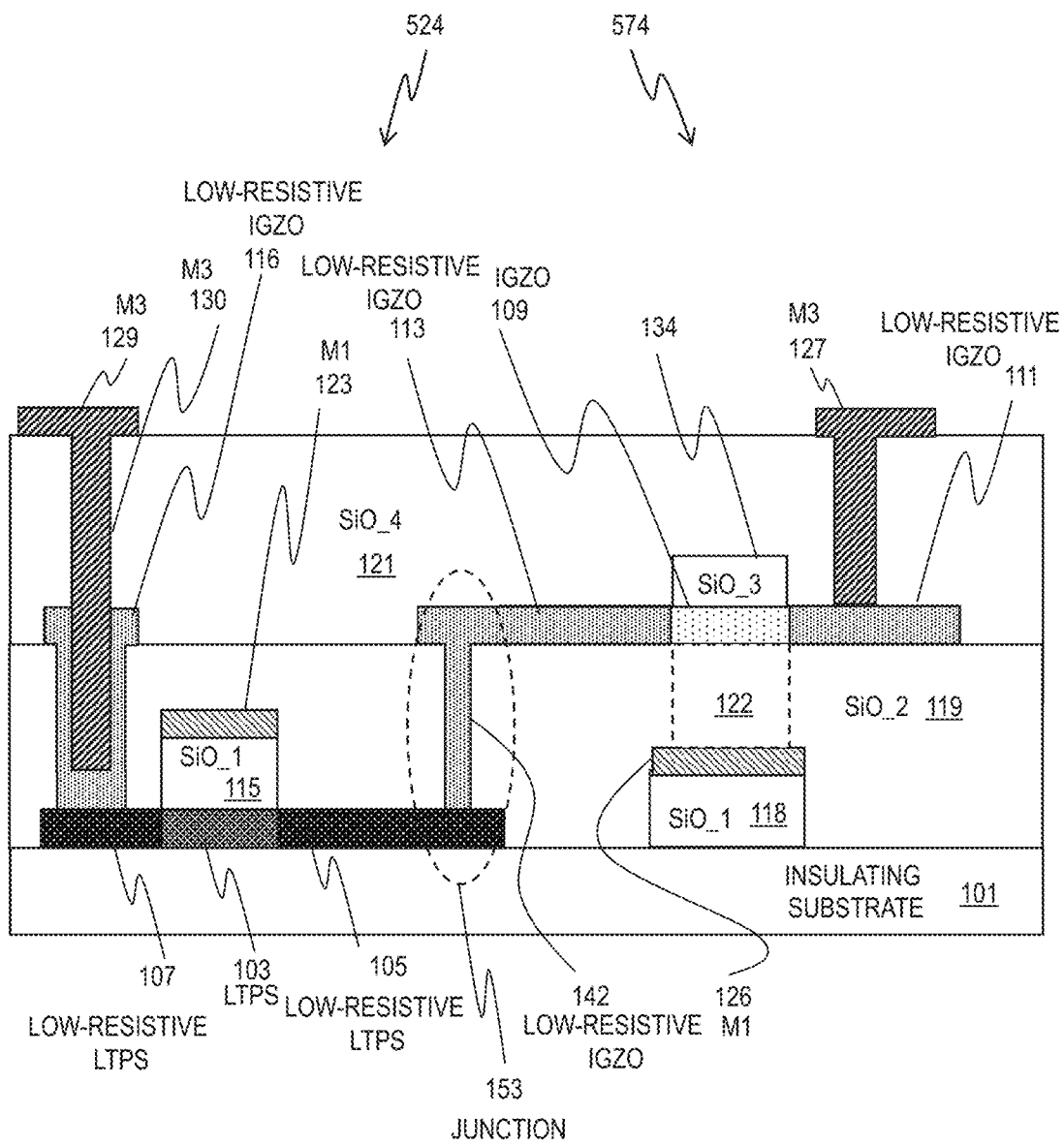
FIG. 24 illustrates cross-sectional structures of a low-temperature polysilicon TFT and an oxide semiconductor TFT whose sources/drains are connected with each other through a via.

Still another configuration example of a low-temperature polysilicon TFT and an oxide semiconductor TFT whose sources/drains are connected with each other through a via is described. FIG. 24 illustrates cross-sectional structures of a low-temperature polysilicon TFT 524 and an oxide semiconductor TFT 574 whose sources/drains are connected with each other through a via. In the following, differences from the configuration example illustrated in FIG. 21 are mainly described.

The configuration example in FIG. 24 includes a low-resistive IGZO film 116 between a source/drain 107 of the low-temperature polysilicon TFT 524 and a via 130. The low-resistive IGZO film 116 is on the same layer as the source/drain 111 and 113 of the oxide semiconductor TFT 574 and formed together with them in the same process. The low-resistive IGZO film 116 is located between the source/drain 107 (a part thereof) of the low-temperature polysilicon TFT 524 and the via 130 when seen in the layering direction, and is in contact with and interconnects them. The via 130 is provided to connect an electrode 129 and the source/drain 107 and is continued from the electrode 129.

The low-resistive IGZO film 116 in the configuration example in FIG. 24 eliminates the necessity of HF treatment for removing the silicon oxide on the surface of the source/drain 107, like the low-resistive IGZO film 114 illustrated in FIG. 23.

Embodiment 9

Still another configuration example of a low-temperature polysilicon TFT and an oxide semiconductor TFT whose sources/drains are in direct contact with each other is described. In the following, differences from the configuration example illustrated in FIG. 7 are mainly described. The configuration example described in the following includes a silicon nitride film covering at least a part of the polysilicon TFT and a silicon oxide film provided between the silicon nitride film and the oxide semiconductor TFT. The silicon nitride film eliminates the necessity of hydrotreatment on the polysilicon and the silicon oxide film prevents the hydrogen in the silicon nitride film from diffusing into the oxide semiconductor film.

Figure 25:
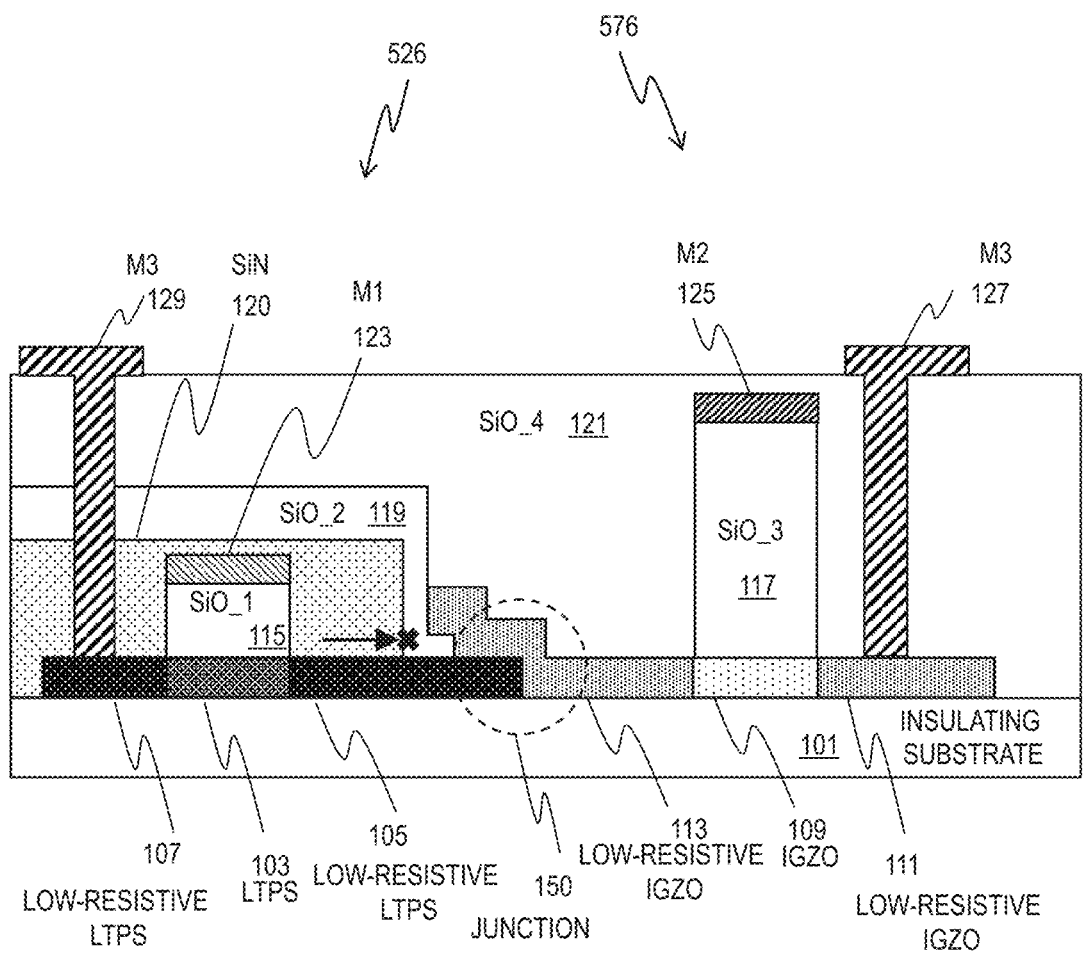
FIG. 25 illustrates cross-sectional structures of a low-temperature polysilicon TFT and an oxide semiconductor TFT whose sources/drains are in direct contact with each other.

FIG. 25 illustrates cross-sectional structures of a low-temperature polysilicon TFT 526 and an oxide semiconductor TFT 576 whose sources/drains are in direct contact with each other. The configuration example in FIG. 25 includes a silicon nitride film 120 provided above and in contact with the source/drain 107 and a part of the source/drain 105. The silicon nitride film 120 is an interlayer insulating film.

The configuration example in FIG. 25 includes another interlayer insulating film 119 made of silicon oxide between the source/drain 113 (the oxide semiconductor film) of the oxide semiconductor TFT 576 and the silicon nitride film 120. The silicon nitride film 120 is covered with the interlayer insulating film 119 and the oxide semiconductor film is distant from the silicon nitride film 120. The junction 150 is located between the interlayer insulating film 119 and the interlayer insulating film 121 (outer than the interlayer insulating film 119).

The silicon nitride film 120 allows elimination of hydrotreatment on the low-temperature polysilicon film. The interlayer insulating film 119 works as a barrier film to prevent the hydrogen in the silicon nitride film 120 from diffusing into the oxide semiconductor film.

Figure 26:
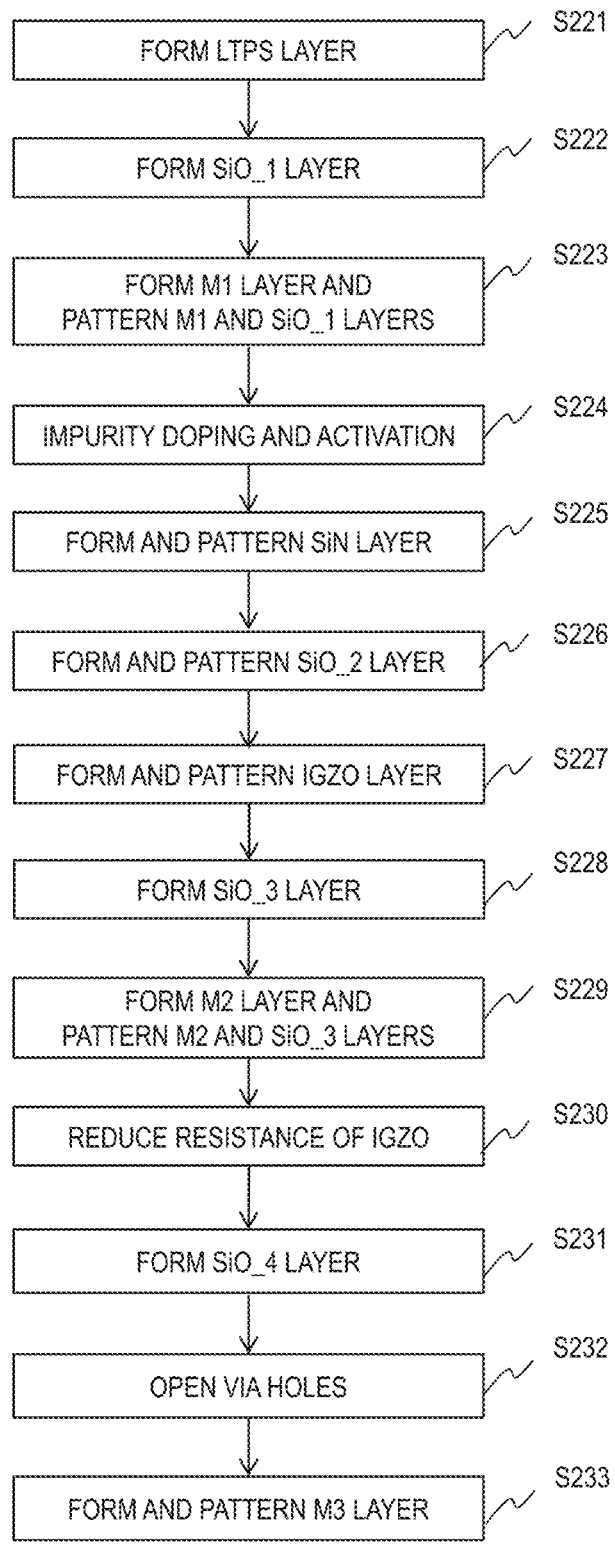
FIG. 26 is a flowchart of an example of a method of manufacturing the configuration example illustrated in FIG. 25.

FIG. 26 is a flowchart of an example of a method of manufacturing the configuration example illustrated in FIG. 25. The steps S221 to S223 are the same as the steps S121 to S123 in the flowchart of FIG. 8. The step S224 does not include the hydrotreatment in the Step S124. After the step S224, the method forms a silicon nitride film by CVD and patterns the silicon nitride film by photolithography (S225). Hydrogen is supplied to the low-temperature polysilicon film because of formation of the silicon nitride film. The steps S226 to S233 are the same as the steps S125 to S132 in the flowchart of FIG. 8.

Embodiment 10

Figure 27:
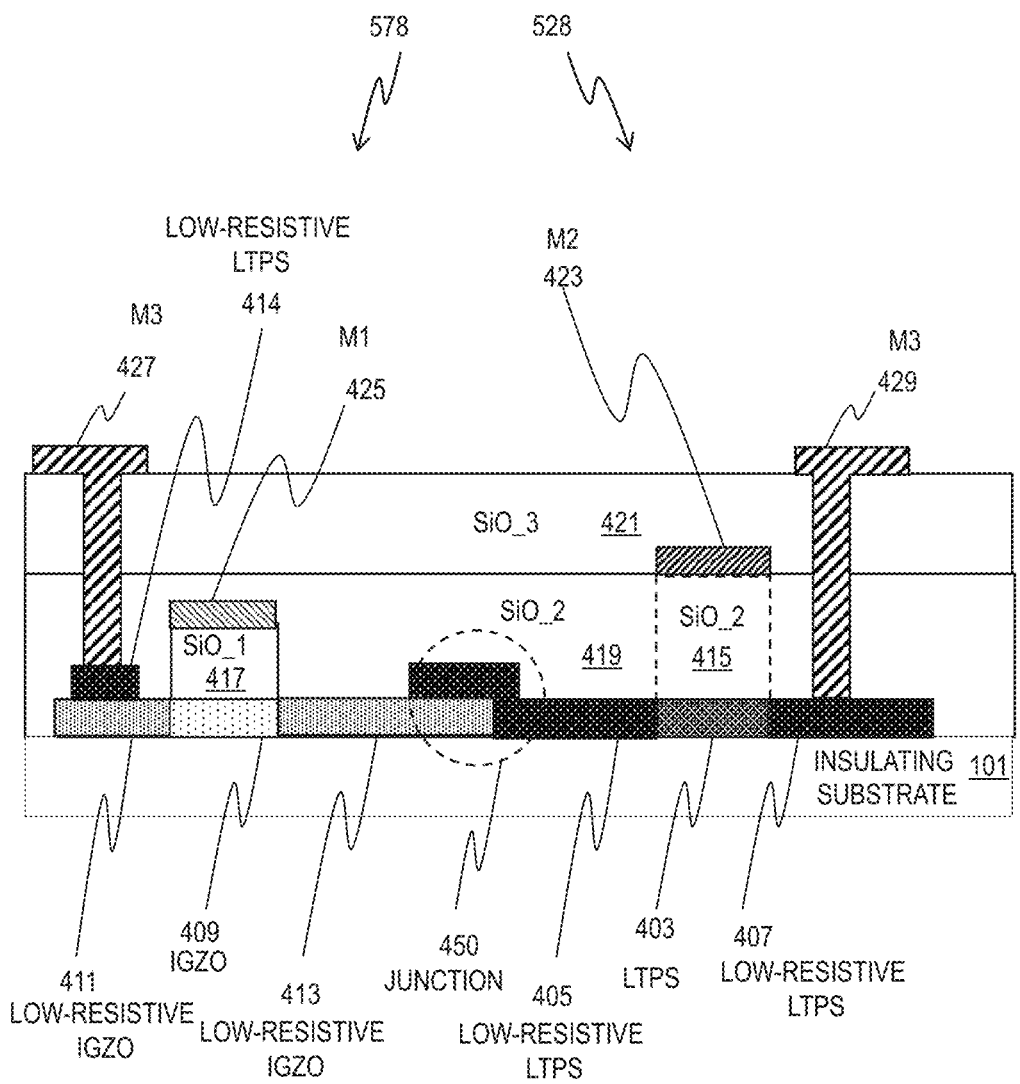
FIG. 27 illustrates cross-sectional structures of a low-temperature polysilicon TFT and an oxide semiconductor TFT whose sources/drains are in direct contact with each other.

Still another configuration example of a low-temperature polysilicon TFT and an oxide semiconductor TFT whose sources/drains are in direct contact with each other is described. FIG. 27 illustrates cross-sectional structures of a low-temperature polysilicon TFT 528 and an oxide semiconductor TFT 578 whose sources/drains are in direct contact with each other. Compared to the configuration example in Embodiment 1 illustrated in FIG. 3, the order of formation of the low-temperature polysilicon film and the oxide semiconductor film is opposite. The order of formation of the low-temperature polysilicon film and the oxide semiconductor film can be opposite in the other embodiments.

The oxide semiconductor TFT 578 includes a source and a drain 411 and 413 and a channel 409 sandwiched by the source/drain 411 and 413 in an in-plane direction. The source/drain 411 and 413 are made of IGZO reduced in resistance. The channel 409 is made of IGZO not reduced in resistance. The source/drain 411 and 413 and the channel 409 (semiconductor film) are included in an oxide semiconductor layer. The oxide semiconductor layer is formed directly on am insulating substrate 101. Although the source/drain 411 and 413 and the channel 409 in the example of FIG. 27 is in contact with the insulating substrate 101, another insulating layer (such as a silicon nitride layer) can be provided therebetween.

The oxide semiconductor TFT 578 further includes a gate 425 and a gate insulating film 417 interposed between the gate 125 and the channel 409 in the layering direction. The channel 409, the gate insulating film 417, and the gate 425 are layered in this order from the bottom (from the substrate side) and the gate insulating film 417 is in contact with the channel 409 and the gate 425. The gate 425 is made of metal and included in a metal layer M1. The gate insulating film 417 in this example is made of silicon oxide and included in a silicon oxide layer SiO_1. Although the oxide semiconductor TFT 578 in the example of FIG. 27 has a top-gate structure, the oxide semiconductor TFT 578 can have a bottom-gate structure.

The low-temperature polysilicon TFT 528 includes a source and a drain 405 and 407 and a channel 403 sandwiched by the source/drain 405 and 407 in an in-plane direction. The source/drain 405 and 407 are made of low-temperature polysilicon reduced in resistance by being doped with high-concentration impurities. The channel 403 is made of low-temperature polysilicon not reduced in resistance. The source/drain 405 and 407 and the channel 403 (semiconductor film) are included in a low-temperature polysilicon layer. The low-temperature polysilicon layer is formed directly on the insulating substrate 101. Although the source/drain 405 and 407 and the channel 403 in the example of FIG. 27 are in contact with the insulating substrate 101, another insulating layer (such as a silicon nitride layer) can be provided therebetween.

The low-temperature polysilicon TFT 528 further includes a gate 423 and a gate insulating film 415 interposed between the gate 423 and the channel 403 in the layering direction. The channel 403, the gate insulating film 415, and the gate 423 are layered in this order from the bottom (from the substrate side) and the gate insulating film 415 is in contact with the channel 403 and the gate 423. The gate 423 is made of metal and included in a metal layer M2. The gate insulating film 415 in this example is made of silicon oxide and included in a silicon oxide layer SiO_2. Although the low-temperature polysilicon TFT 528 in the example of FIG. 27 has a top-gate structure, the low-temperature polysilicon TFT 528 can have a bottom-gate structure.

The source/drain 413 of the oxide semiconductor TFT 578 and the source/drain 405 of the low-temperature polysilicon TFT 528 are connected at a junction 450. At the junction 450, a part of the source/drain 413 of the oxide semiconductor TFT 578 and a part of the source/drain 405 of the low-temperature polysilicon TFT 528 overlap each other and are layered. These parts are layered when seen in the layering direction and further, they are in direct contact with each other. In the example of FIG. 27, one end of the source/drain 405 of the low-temperature polysilicon TFT 528 is located upper than one end of the source/drain 413 of the oxide semiconductor TFT 578.

An interlayer insulating film 419 covers and is in contact with the channel 403 and the source/drain 405 and 407 of the low-temperature polysilicon TFT 428 and further, the oxide semiconductor TFT 578. The interlayer insulating film 419 in this example is made of silicon oxide and included in the silicon oxide layer SiO_2.

An interlayer insulating film 421 is provided above the interlayer insulating film 419 and covers the low-temperature polysilicon TFT 528 and the oxide semiconductor TFT 578 (which is covered with the interlayer insulating film 419 interposed therebetween). The interlayer insulating film 421 in this example is made of silicon oxide and included in a silicon oxide layer SiO_3.

An electrode 429 is provided above the interlayer insulating film 421 and connected with the source/drain 407 of the low-temperature polysilicon TFT 528 through a via hole formed in the interlayer insulating films 419 and 421. The via inside the via hole interconnects the electrode 429 and the source/drain 407. The electrode 429 and the via is made of the same metal. The electrode 429 is made of metal and included in a metal layer M3.

An electrode 427 is provided above the interlayer insulating film 421 and connected with the source/drain 411 of the oxide semiconductor TFT 578 through a via hole formed in the interlayer insulating films 419 and 421. The via inside the via hole interconnects the electrode 427 and the low-resistive LTPS film 414 on the source/drain 411. The electrode 427 and the via is made of the same metal. The electrode 427 is made of metal and included in the metal layer M3. The insulating layers can be made of a material different from silicon oxide, such as silicon nitride.

Figure 28:
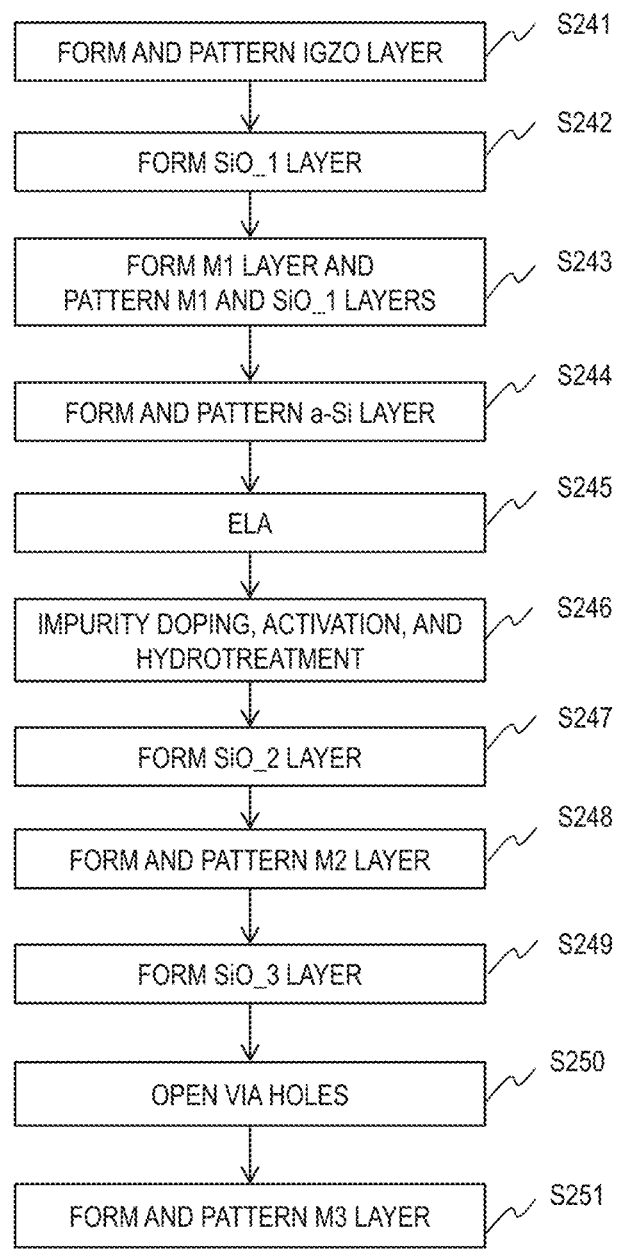
FIG. 28 is a flowchart of an example of a method of manufacturing the configuration example illustrated in FIG. 27.

FIG. 28 is a flowchart of an example of the method of manufacturing the configuration example illustrated in FIG. 27. The method forms an IGZO layer by sputtering and patterns the IGZO layer by photolithography (S241). Next, the method forms a silicon oxide layer SiO_1 by CVD (S242), further forms a metal layer M1 by sputtering, and patterns the metal layer M1 and the silicon oxide layer SiO_1 together by photolithography (S243).

Next, the method deposits an amorphous silicon film by CVD and patterns the amorphous silicon film by photolithography (S244). The method crystalizes the amorphous silicon film by excimer laser annealing (ELA) to prepare a (low-temperature) polysilicon film and further reduces the source/drain regions of the IGZO layer using the metal layer M1 (the gate 425) as a mask (S245).

Next, the method dopes the source/drain regions of the polysilicon film with impurities and activates the impurities. Further, the method terminates the dangling bonds by hydrotreatment (S246). Next, the method forms a silicon oxide layer SiO_2 (S247). Next, the method forms a metal layer M2 by sputtering and patterns the metal layer M2 by photolithography (S248). The materials and the structures of the gates 423 and 425 can be the same as those in Embodiment 1.

Next, the method forms a silicon oxide layer SiO_3 (S249). Next, the method opens via holes in the silicon oxide layers SiO_2 and SiO_3 by anisotropic etching (S250). Next, the method forms a metal layer M3 by sputtering and patterns the metal layer M3 by photolithography (S251). The metal layer M3 includes electrodes 427 and 429 and further, vias (the inner parts coating or filling the via holes) for connecting the electrodes 427 and 429 to the source/drain 411 of the oxide semiconductor TFT and the source/drain 407 of the low-temperature polysilicon TFT. The materials and the structures of the electrodes 427 and 429 and the vias can be the same as those in Embodiment 1.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film device comprising: a polysilicon element; and an oxide semiconductor element, wherein the polysilicon element includes a first part made of low-resistive polysilicon, wherein the oxide semiconductor element includes a second part made of low-resistive oxide semiconductor, the first part is included in a polysilicon film, the second part is included in an oxide semiconductor film, and the polysilicon film and the oxide semiconductor film are disposed directly on a co-planar surface of a common insulating layer, and wherein the first part and the second part are disposed to overlap each other and are connected.

2. The thin-film device according to claim 1, wherein the first part is in direct contact with the second part.

3. The thin-film device according to claim 1, wherein the first part is connected with the second part through a metal film interposed therebetween.

4. A thin-film device comprising: a polysilicon element; and an oxide semiconductor element, wherein the polysilicon element includes a first part made of low-resistive polysilicon, wherein the oxide semiconductor element includes a second part made of low-resistive oxide semiconductor, wherein the first part and the second part are disposed to overlap each other and are connected, and wherein the first part is connected with the second part through a metal silicide film interposed therebetween, wherein the polysilicon element is a polysilicon thin-film transistor, wherein the oxide semiconductor element is an oxide semiconductor thin-film transistor, wherein the first part is included in a first source/drain of the polysilicon thin-film transistor, and wherein the second part is included in a first source/drain of the oxide semiconductor thin-film transistor.

5. The thin-film device according to claim 4, wherein the metal silicide film is a layer of a mixture of at least one of the constituent elements of the oxide semiconductor, silicon element, and a metal element.

6. The thin-film device according to claim 4, further comprising a via that is located between the first part and the second part, the via connecting the first part to the second part,
wherein a first one of the first part and the second part is disposed on a layer higher than a second one of the first part and the second part, and
wherein the via is made of the same material as the first one of the first part and the second part.

7. The thin-film device according to claim 1, wherein ions are implanted in the first part and the second part to reduce contact resistance.

8. The thin-film device according to claim 1,
wherein the polysilicon element is a polysilicon thin-film transistor,
wherein the oxide semiconductor element is an oxide semiconductor thin-film transistor,
wherein the first part is included in a first source/drain of the polysilicon thin-film transistor, and
wherein the second part is included in a first source/drain of the oxide semiconductor thin-film transistor.

9. The thin-film device according to claim 8,
wherein the polysilicon thin-film transistor includes a gate disposed above a channel with a gate insulating film interposed therebetween,
wherein the gate is covered with an interlayer insulating film, and
wherein a part of the interlayer insulating film is covered with a part of the first source/drain of the oxide semiconductor thin-film transistor.

10. The thin-film device according to claim 8,
wherein the polysilicon thin-film transistor further includes a second source/drain different from the first source/drain of the polysilicon thin-film transistor, and
wherein the second source/drain is connected with a metal film through a low-resistive oxide semiconductor film made of a same material as the second part.

11. The thin-film device according to claim 8, further comprising:
a silicon nitride film covering at least a part of the polysilicon thin-film transistor; and
a silicon oxide film disposed between the silicon nitride film and the oxide semiconductor thin-film transistor.

12. The thin-film device according to claim 4, wherein the polysilicon thin-film transistor includes a gate disposed above a channel with a gate insulating film interposed therebetween, wherein the gate is covered with an interlayer insulating film, and wherein a part of the interlayer insulating film is covered with a part of the first source/drain of the oxide semiconductor thin-film transistor.

13. The thin-film device according to claim 4, wherein the first part is covered with an interlayer insulating film, wherein the second part is disposed above the interlayer insulating film, and wherein the first part is connected with the second part through a via provided in the interlayer insulating film and including the metal silicide film.

14. The thin-film device according to claim 4, wherein the polysilicon thin-film transistor further includes a second source/drain different from the first source/drain of the polysilicon thin-film transistor, and wherein the second source/drain is connected with a metal film through a low-resistive oxide semiconductor film made of a same material as the second part.

15. The thin-film device according to claim 4, wherein a silicon nitride film covering at least a part of the polysilicon thin-film transistor, and a silicon oxide film disposed between the silicon nitride film and the oxide semiconductor thin-film transistor, wherein the first part is connected with the second part through the metal silicide film interposed therebetween in a via provided in the silicon nitride film, and wherein the second part is connected with a first source/drain of the oxide semiconductor thin-film through a metal electrode.

* * * * *